United States Patent
Fujita et al.

(10) Patent No.: US 8,036,604 B2
(45) Date of Patent: Oct. 11, 2011

(54) TRANSMITTING AND RECEIVING CIRCUIT AND SEMICONDUCTOR DEVICE INCLUDING THE SAME

(75) Inventors: Masashi Fujita, Machida (JP); Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 960 days.

(21) Appl. No.: 12/003,112

(22) Filed: Dec. 20, 2007

(65) Prior Publication Data
US 2008/0149738 A1 Jun. 26, 2008

(30) Foreign Application Priority Data
Dec. 26, 2006 (JP) ................................. 2006-349945

(51) Int. Cl.
H04B 1/38 (2006.01)
(52) U.S. Cl. ......................................... 455/73
(58) Field of Classification Search ...................... 455/73
See application file for complete search history.

(56) References Cited

U.S. PATENT DOCUMENTS

| | | | |
|---|---|---|---|
| 3,555,182 A * | 1/1971 | Griepentrog | 348/535 |
| 3,887,886 A * | 6/1975 | Okada et al. | 332/168 |
| 6,097,292 A * | 8/2000 | Kelly et al. | 340/572.7 |
| 6,215,989 B1 * | 4/2001 | Otaka | 455/234.1 |
| 6,593,845 B1 * | 7/2003 | Friedman et al. | 340/10.33 |
| 7,151,436 B2 * | 12/2006 | Fischer et al. | 340/10.1 |
| 7,158,049 B2 * | 1/2007 | Hoefel et al. | 340/855.7 |
| 7,277,687 B2 * | 10/2007 | Terry | 455/293 |
| 7,313,037 B2 * | 12/2007 | Kang et al. | 365/200 |
| 7,317,242 B2 * | 1/2008 | Takizawa | 257/656 |
| 7,515,050 B2 * | 4/2009 | Pardoen et al. | 340/572.7 |
| 7,606,532 B2 * | 10/2009 | Wuidart | 455/41.1 |
| 7,800,436 B2 * | 9/2010 | Yamazaki | 329/350 |
| 7,817,015 B1 * | 10/2010 | Tiernay et al. | 340/10.4 |
| 2003/0197598 A1 * | 10/2003 | Hayashi | 340/310.07 |
| 2004/0145452 A1 * | 7/2004 | Fischer et al. | 340/10.1 |
| 2005/0057302 A1 * | 3/2005 | Andle | 329/370 |
| 2005/0231438 A1 * | 10/2005 | Pillai et al. | 343/860 |
| 2006/0267766 A1 * | 11/2006 | Kang et al. | 340/572.1 |
| 2006/0268631 A1 * | 11/2006 | Kang et al. | 365/192 |
| 2007/0046369 A1 * | 3/2007 | Schober et al. | 330/7 |
| 2007/0127560 A1 * | 6/2007 | Kang et al. | 375/222 |
| 2008/0143192 A1 * | 6/2008 | Sample et al. | 307/149 |
| 2010/0072285 A1 * | 3/2010 | Nishijima | 235/492 |

FOREIGN PATENT DOCUMENTS

JP 2002-152080 5/2002

* cited by examiner

*Primary Examiner* — Lewis West
(74) *Attorney, Agent, or Firm* — Eric J. Robinson; Robinson Intellectual Property Law Office, P.C.

(57) ABSTRACT

An object is to provide a circuit configuration with which the number of transistors can be reduced and power conversion efficiency can be prevented from being reduced, in a transmitting and receiving circuit. The transmitting and receiving circuit includes a voltage doubler rectifier circuit having N stages, each of which includes a capacitor, where N is a positive integer. The voltage doubler rectifier circuit having N stages is connected to a circuit having a modulation function. In the capacitor in any one of the N stages, one electrode of the one capacitor is connected to an input terminal of the transmitting and receiving circuit, and a node to which the other electrode of the one capacitor is connected is connected to a circuit having a demodulation function. Since the transmitting and receiving circuit can be formed of fewer transistors, it can be reduced in size. Since a reduction in power conversion efficiency can be prevented, a power supply potential can be efficiently generated.

14 Claims, 26 Drawing Sheets

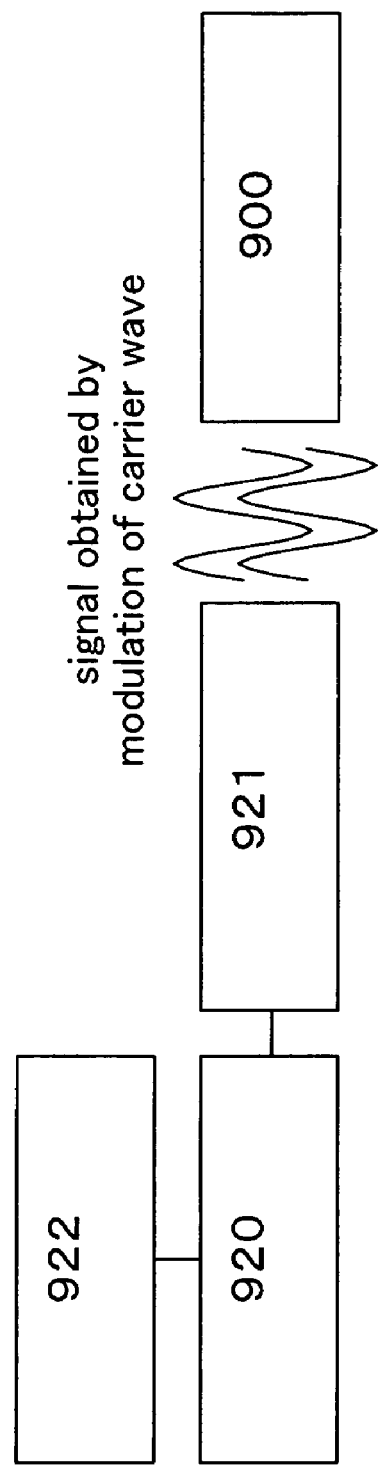

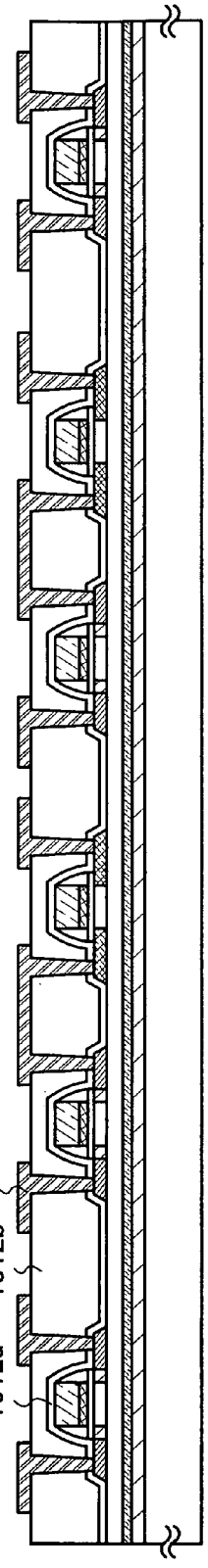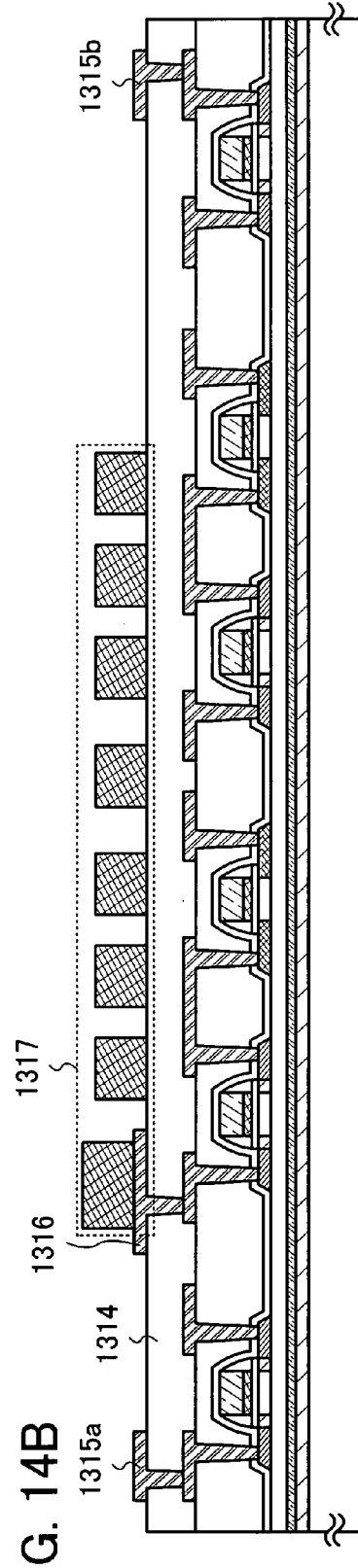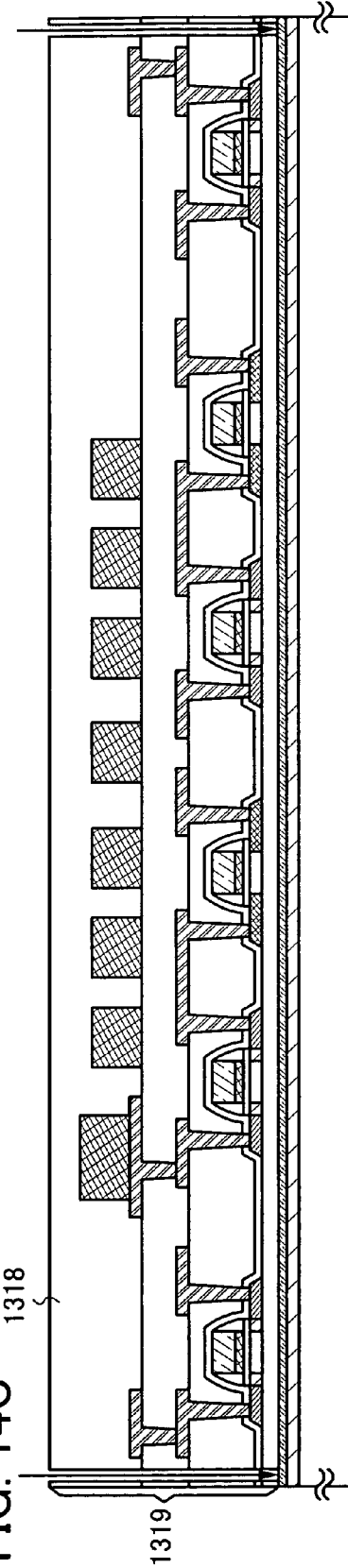

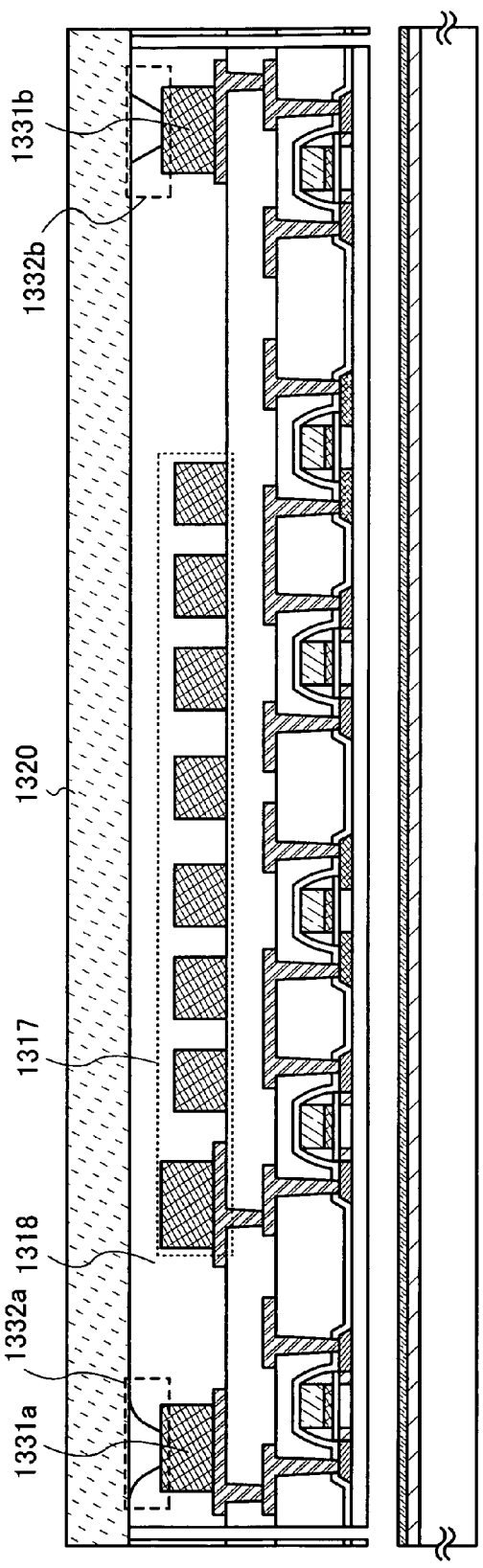
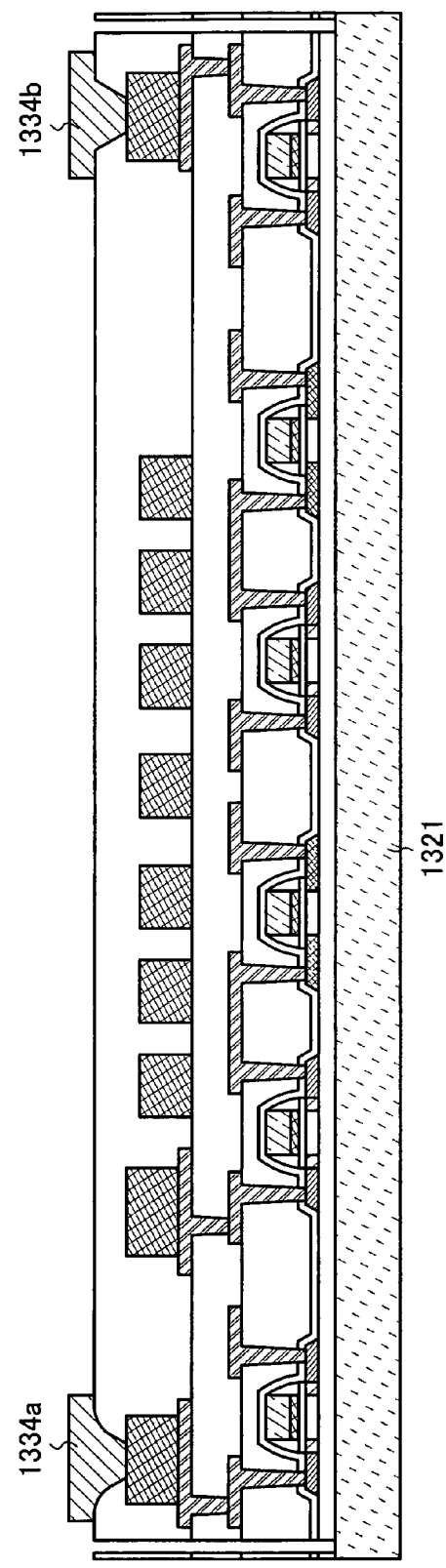

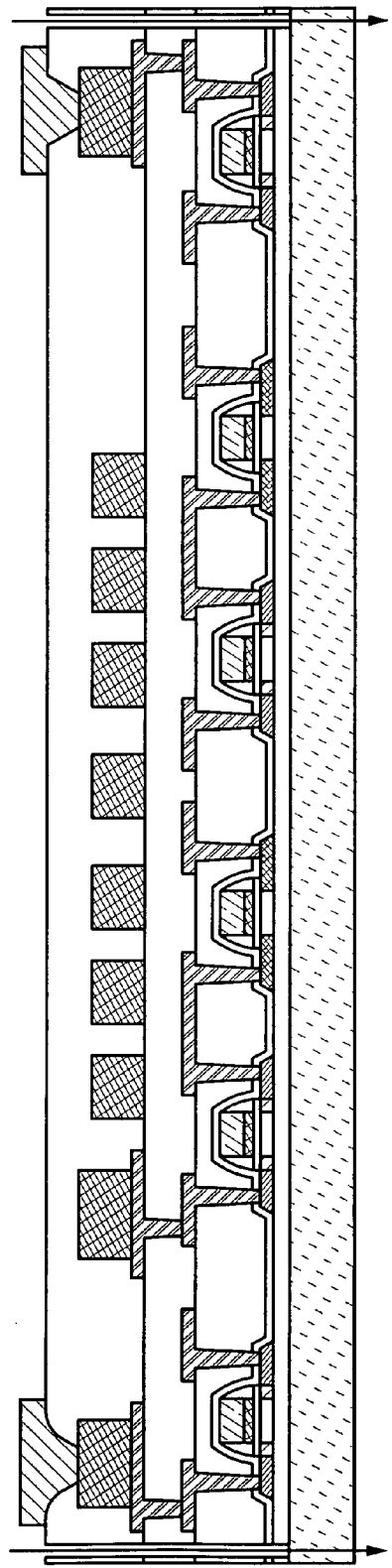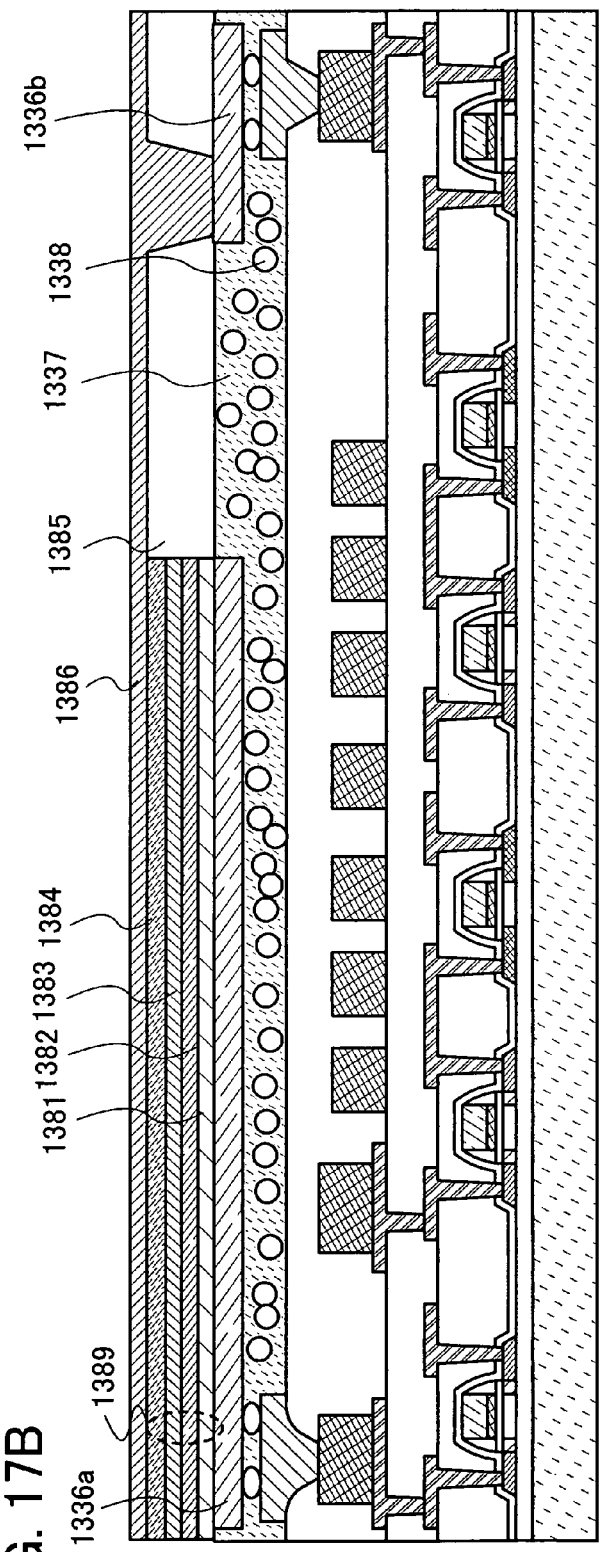

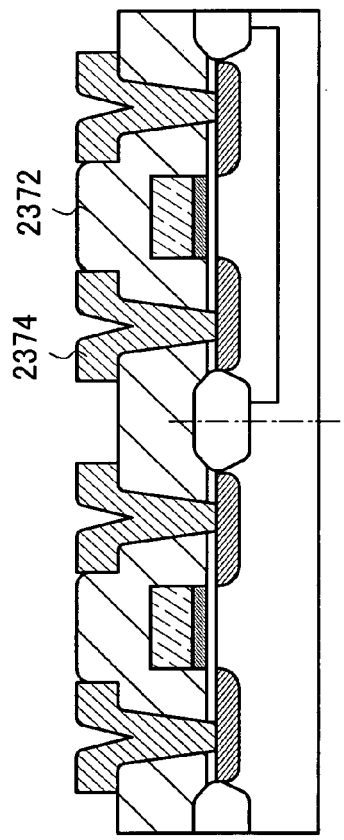
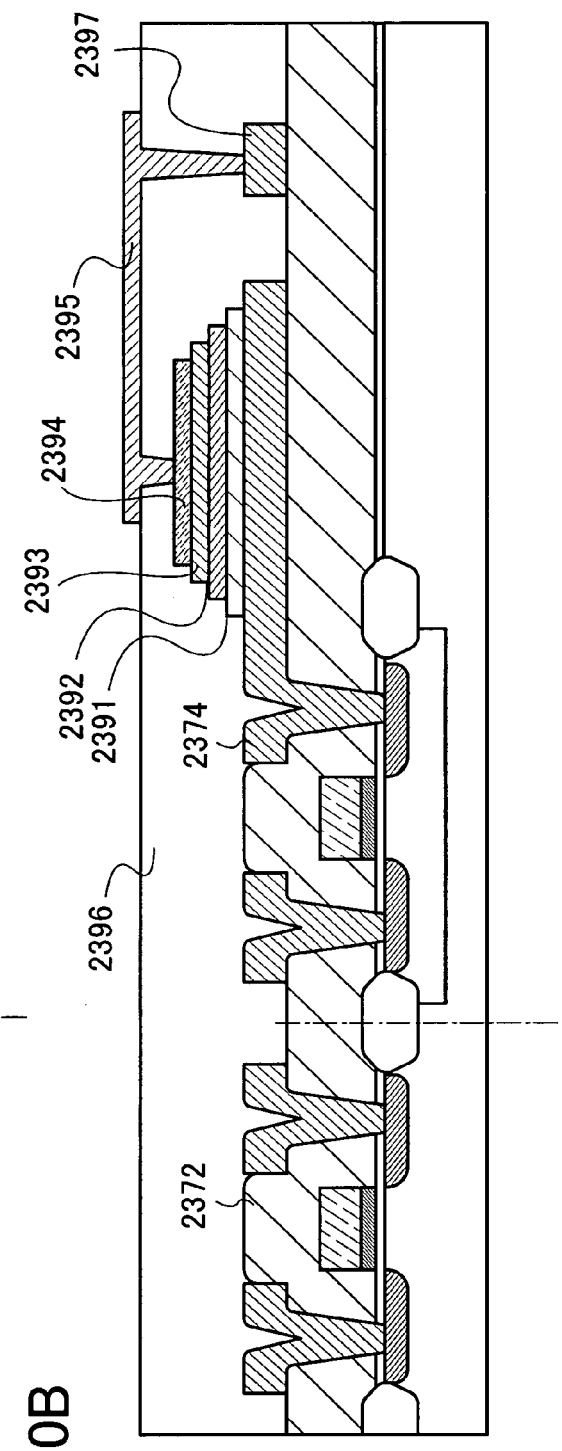

TRANSMITTING AND RECEIVING CIRCUIT AND SEMICONDUCTOR DEVICE INCLUDING THE SAME

BACKGROUND OF THE INVENTION

1. Field of the Invention

The present invention relates to a transmitting and receiving circuit for transmitting and receiving data, and also relates to a semiconductor device including a transmitting and receiving circuit for transmitting and receiving data.

2. Description of the Related Art

In recent years, an individual identification technology using wireless communication (hereinafter referred to as a wireless communication system) has attracted attention. In particular, as a data carrier which communicates data by wireless communication, an individual identification technology using an RF tag (hereinafter collectively referred to as a semiconductor device regardless of the shape such as a card shape or a ship shape) utilizing RFID (Radio Frequency Identification) technology has attracted attention. The semiconductor device is also called an IC (Integrated Circuit) tag, an IC chip, an RFID tag, an RF tag, a wireless tag, an electronic tag, or wireless chip. The individual identification technology using a semiconductor device has been useful for production, management, or the like of an individual object, and application to personal authentication has been promoted.

The term "wireless communication system" here refers to a communication system for transmitting and receiving data between a receiver-transmitter with a power supply source, such as a reader/writer, and a transmitter-receiver such as a semiconductor device.

In such a wireless communication system, a reader/writer and a semiconductor device are not necessarily physically connected to each other. That is, the reader/writer can communicate with the semiconductor device so that data can be transmitted and received to/from the semiconductor device, as long as there is the semiconductor device in a region designated by the reader-writer.

Semiconductor devices can be broadly categorized into two types: active semiconductor devices and passive semiconductor devices. An active semiconductor device incorporates a primary battery and operates by obtaining a power supply potential from the battery. Meanwhile, a passive semiconductor device does not incorporate a battery. A passive semiconductor device generates a power supply potential therein by using a wireless signal from a reader/writer and operates with the power supply potential.

In a wireless communication system, when data is transmitted and received between a reader/writer and a plurality of semiconductor devices at the same time, distances between the reader/writer and the plurality of semiconductor devices (hereinafter referred to as a communication distance) are not completely the same. There may be a case where a communication distance varies from hour to hour; for example, products to each of which a semiconductor device is attached may be packed in a carton, be put on a forklift, and pass in front of a reader/writer.

A wireless signal transmitted by a reader/writer attenuates in proportion to the square of a distance between the reader/writer and a semiconductor device. The amplitude of a wireless signal fluctuates in accordance with power received by a semiconductor device. Therefore, power to be supplied to a semiconductor device from a reader/writer varies depending on a communication distance.

Therefore, in a wireless communication system using a passive semiconductor device, when a reader/writer and a semiconductor device are away from each other and thus a communication distance is long, only weak power is supplied to the semiconductor device.

Since a passive semiconductor device needs a certain level of power for normal operation, in the case where a semiconductor device can receive only weak power, the semiconductor device cannot generate a power supply potential needed for operation and thus cannot operate.

A communication distance has a relation to a performance of a transmitting and receiving circuit of a semiconductor device. A communication distance can be extended by improvement of efficiency in conversion of power received by a transmitting and receiving circuit into a power supply potential or DC power (hereinafter referred to as power conversion efficiency). The above-described transmitting and receiving circuit has a rectification function for converting a received power of a wireless signal (hereinafter referred to as received power) into a power supply potential, a demodulation function for extracting data from a wireless signal, and a modulation function for changing an input impedance of a semiconductor device by changing an input impedance of a transmitting and receiving circuit, and then transmitting data.

An active semiconductor device incorporates a primary battery. An active semiconductor device can operate regardless of a communication distance while a charge is in a primary battery and cannot operate when no charge is therein.

As applications of active semiconductor devices and passive semiconductor devices, semiconductor devices each incorporating a secondary battery have been developed. Power conversion efficiency of a transmitting and receiving circuit in the case of a semiconductor device incorporating a secondary battery affects time for charging a secondary battery and the level of power for charging. Therefore, in the case of a transmitting and receiving circuit as a semiconductor device incorporating a secondary battery, reduction in charging time or storage of weaker charging power can be achieved by improvement of power conversion efficiency.

FIG. 6 shows a conventional transmitting and receiving circuit of a semiconductor device (see Patent Document 1: Japanese Published Patent Application No. 2002-152080). A transmitting and receiving circuit 626 of the semiconductor device shown in FIG. 6 has a circuit configuration in which a voltage doubler rectifier circuit 602 having two stages and a voltage doubler rectifier circuit 603 having two stages are connected in parallel. The voltage doubler rectifier circuit 602 includes an input terminal 600, an input terminal 601, an output terminal 613, four transistors, and four capacitors. In the transmitting and receiving circuit 626, the voltage doubler rectifier circuit 602 has a rectification function and outputs a DC potential obtained by rectification of an AC signal inputted from the input terminal to the output terminal 613. Further, in FIG. 6, the voltage doubler rectifier circuit 602 is additionally provided with a transistor 604 and a transistor 605 and is controlled by a terminal 607 so that a modulation function is provided.

On the other hand, in FIG. 6, the voltage doubler rectifier circuit 603 includes the input terminal 600, the input terminal 601, an output terminal 623, four transistors, and four capacitors. In FIG. 6, the voltage doubler rectifier circuit 603 is connected to a transistor 606 so that a demodulation function is provided. In the voltage doubler rectifier circuit 603 provided with a demodulation function, which is shown FIG. 6, the transistor 606 needs a bias terminal 624. A given bias voltage in accordance with a voltage value of the output terminal 613, which is a power supply potential, is supplied to the bias terminal 624 so that a current load in proportion to a consumed current of a circuit of a next stage, which is the load of the voltage doubler rectifier circuit 602, can be achieved.

In FIG. 6, with the voltage doubler rectifier circuit 602 provided with a modulation function and the voltage doubler rectifier circuit 603 provided with a demodulation function, the transmitting and receiving circuit 626 achieves a rectification function for converting a received power into a power supply potential, a demodulation function for extracting data, and a modulation function for transmitting data.

SUMMARY OF THE INVENTION

The transmitting and receiving circuit of a semiconductor device, which is shown in FIG. 6, has a configuration in which two voltage doubler rectifier circuits are connected in parallel. Therefore, the number of elements and the area of the transmitting and receiving circuit are increased. Each transistor of the transmitting and receiving circuit has a threshold voltage $V_{th}$. When the input voltage is $V_{in}$ and the threshold voltage of a transistor included in a voltage doubler rectifier circuit is $V_{th}$, the theoretical formula for obtaining the output voltage $V_{out}$ of the voltage doubler rectifier circuit is expressed by Formula 1.

$$V_{out}=2N(V_{in}-V_{th}) \quad \text{[Formula 1]}$$

In Formula 1, N represents the number of stages of the voltage doubler rectifier circuit. When the voltage doubler rectifier circuit has two stages as shown in the transmitting and receiving circuit in FIG. 6, N=2 is satisfied. Therefore, in the transmitting and receiving circuit 626 shown in FIG. 6, a loss of $(4 \times V_{th})$ is caused in the voltage doubler rectifier circuit 602 for generating a power supply potential from received power. Similarly, in the transmitting and receiving circuit 626 shown in FIG. 6, a loss of $(4 \times V_{th})$ is caused in the voltage doubler rectifier circuit 603 having a demodulation function due to demodulation of a signal. The voltage doubler rectifier circuit 602 and the voltage doubler rectifier circuit 603 are connected in parallel; therefore, in the structure of the transmitting and receiving circuit 626 shown in FIG. 6, a total loss of the transmitting and receiving circuit is $(8 \times V_{th})$, which leads to lower power conversion efficiency. Lower power conversion efficiency shortens a communication distance in the case of a passive semiconductor device.

In view of the above-described conditions, an object of the present invention is to provide a circuit configuration with which the number of transistors can be reduced and power conversion efficiency can be prevented from being reduced, in the transmitting and receiving circuit in a semiconductor device.

The present invention provides a transmitting and receiving circuit having a following structure in order to achieve the above-described object.

The transmitting and receiving circuit of the present invention includes a voltage doubler rectifier circuit having N stages, each of which includes a detection capacitor. The voltage doubler rectifier circuit having N stages is connected to a circuit having a modulation function. In the detection capacitor in any one of the N stages, one electrode of the one detection capacitor is connected to an input terminal of the transmitting and receiving circuit, and a node to which the other electrode of the one detection capacitor is connected is connected to a circuit having a demodulation function.

Another semiconductor device of the present invention includes an antenna which receives a radio wave supplied externally, a transmitting and receiving circuit which is connected to the antenna and which performs output, modulation, and demodulation of a DC voltage when a wireless signal received by the antenna is inputted, a power supply circuit which generates a power supply voltage from the DC voltage, and a memory circuit to which a demodulated signal is inputted. The transmitting and receiving circuit includes a voltage doubler rectifier circuit having N stages, each of which includes a detection capacitor, where N is a positive integer. The voltage doubler rectifier circuit having N stages is connected to a circuit having a modulation function. In the detection capacitor in any one of the N stages, one electrode of the one detection capacitor is connected to an input terminal of the transmitting and receiving circuit, and a node to which the other electrode of the one detection capacitor is connected is connected to a circuit having a demodulation function.

Each of the circuit having a modulation function and the circuit having a demodulation function of the present invention may include a plurality of diodes.

Each of the plurality of diodes of the present invention may be configured with a diode-connected transistor.

The transistor of the present invention may be an n-channel transistor or a p-channel transistor.

A capacitor and a resistor may be connected to an output terminal of the circuit having a demodulation function of the present invention.

The capacitance of the capacitor of the present invention is 1 to 10 pF, and the resistance of the resistor of the present invention is 10 to 100 kΩ.

A diode may be connected between the output terminal of the circuit having a demodulation function and an output terminal of the voltage doubler rectifier circuit having N stages of the present invention.

A capacitor may be connected to the output terminal of the voltage doubler rectifier circuit having N stages of the present invention.

Note that when A and B are explicitly described as "being electrically connected" in this document (specification, scope of claims, drawings, or the like), following cases are included: a case where A and B are electrically connected (that is, connected with other elements or other circuits interposed between A and B), a case where A and B are functionally connected (that is, connected with other circuits interposed between A and B), and the case where A and B are directly connected (that is, connected without other elements or other circuits interposed between A and B).

Since the transmitting and receiving circuit of the present invention can be formed of fewer transistors without impairing the function thereof, it can be reduced in size. Since the transmitting and receiving circuit of the present invention can prevent a reduction in power conversion efficiency, a power supply potential can be efficiently generated. Further, the transmitting and receiving circuit of the present invention can be reduced in size by an amount proportional to how much the number of elements included in the transmitting and receiving circuit is reduced by, and thus the cost can be reduced.

Regarding the semiconductor device including the transmitting and receiving circuit of the present invention, the transmitting and receiving circuit can be formed of fewer transistors without impairing the function of the transmitting and receiving circuit. Therefore, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

BRIEF DESCRIPTION OF THE DRAWINGS

FIG. 12 is a diagram showing operation of a semiconductor device of the present invention.

FIGS. 14A to 14C are views showing an example of a method for manufacturing a semiconductor device of the present invention.

FIGS. 16A and 16B are views showing an example of a method for manufacturing a semiconductor device of the present invention.

FIGS. 17A and 17B are views showing an example of a method for manufacturing a semiconductor device of the present invention.

FIGS. 20A and 20B are views showing an example of a method for manufacturing a semiconductor device of the present invention.

DETAILED DESCRIPTION OF THE INVENTION

Figure 1:
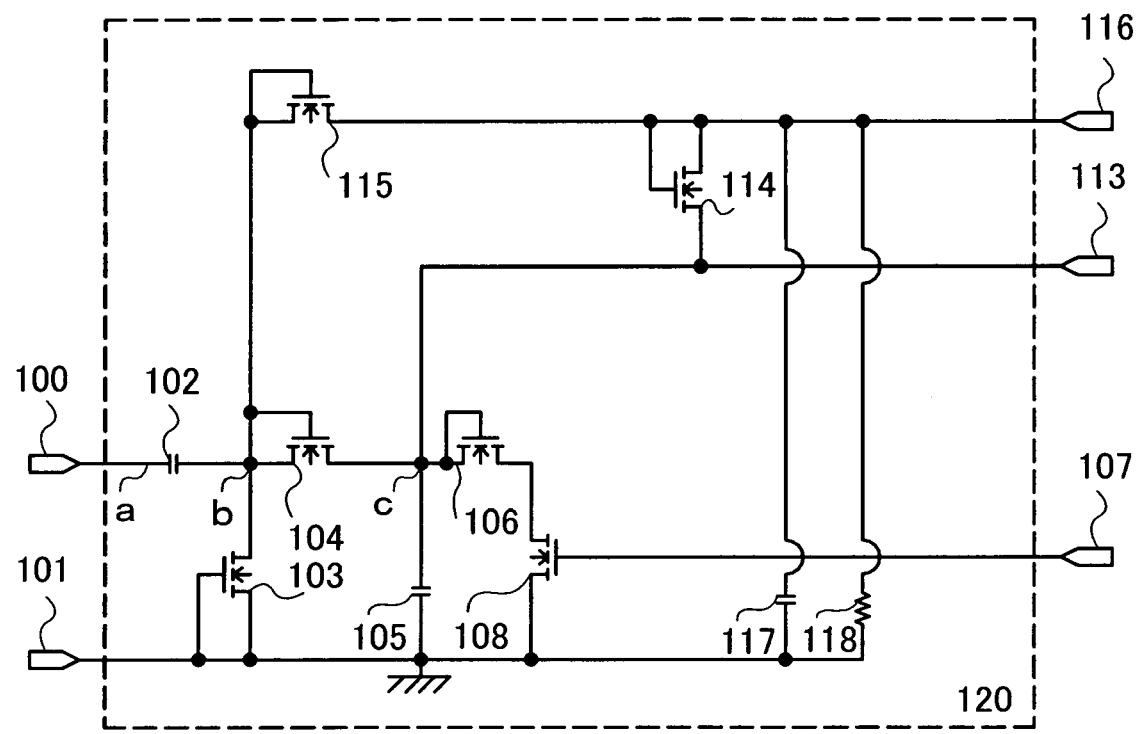
FIG. 1 is a circuit diagram showing a case where a transmitting and receiving circuit of the present invention is configured with an n-channel transistor.

Although the present invention will be fully described by way of embodiment modes and embodiments with reference to the accompanying drawings, it is to be understood by those skilled in the art that various changes and modifications can be made without departing from the spirit and scope of the invention. Therefore, the present invention should not be construed as being limited to the description in the following embodiment modes. Note that common portions and portions having a similar function are given the same reference numerals in all diagrams for describing embodiment modes and embodiments, and description thereof is omitted.

Embodiment Mode 1

In this embodiment mode, a configurational example of the transmitting and receiving circuit of the present invention is described with reference to drawings.

The transmitting and receiving circuit described in this embodiment mode is a voltage doubler rectifier circuit having N stages (N is a positive integer), which is provided with a modulation function and a demodulation function. In this embodiment mode, a specific transmitting and receiving circuit including a voltage doubler rectifier circuit having one stage (N=1) is shown in FIG. 1.

A transmitting and receiving circuit 120 shown in FIG. 1 includes an input terminal 100 (also referred to as a first input terminal) and an input terminal 101 (also referred to as a second input terminal) which are for connecting with an antenna or an external device. In a case where a substrate forming a transistor is a conductor such as a silicon wafer, the input terminal 101 is connected to the substrate and has the same potential as the substrate.

In this embodiment mode, a case where an n-channel transistor is used for the transistor as shown in FIG. 1 is described.

Note that a MOS transistor can be used as the transistor described in this specification.

In FIG. 1, a circuit having a rectification function is shown. The voltage doubler rectifier circuit having one stage includes a capacitor 102 for detection, which is connected to the input terminal 100, a diode-connected transistor (hereinafter referred to as a diode) 103, a diode 104, and a capacitor for smoothing a received AC signal (smoothing capacitor) 105. One terminal of the capacitor 105 is connected to the input terminal 101 and the other terminal is connected to an output terminal 113 of a power supply potential. When a capacitor with high capacitance is provided as the capacitor 105, it is possible to smooth a received AC signal and supply a stable power supply potential to a circuit of a next stage.

Note that a diode-connected transistor (of which a gate terminal and a drain terminal are connected) can be used as the diode described in this specification.

Note that the detection capacitor in this specification means a capacitor connected in series to a previous stage of the circuit having a rectification function. Therefore, in FIG.

1, the capacitor 102 connected to the input terminal 100 corresponds to the detection capacitor.

With the voltage doubler rectifier circuit, a received power can be converted into a power supply potential. By increasing the number of stages of the voltage doubler rectifier circuit of the transmitting and receiving circuit 120, a higher output voltage can be obtained. On the other hand, power conversion efficiency is lowered due to the threshold voltage $V_{th}$ of the transistor. Therefore, it is desirable that the number of stages of the voltage doubler rectifier circuit be properly selected in accordance with an operation voltage and power consumption of a circuit of a next stage, which is connected to the output terminal.

Next, the circuit having a demodulation function in FIG. 1 is described. In order that the voltage doubler rectifier circuit having one stage may be provided with a demodulation function, one terminal of a diode 115 is connected to the capacitor 102. The other terminal of the diode 115 is connected to an output terminal 116 of a demodulation signal. A capacitor 117 and a resistor 118 are connected between nodes having the same potentials as the output terminal 116 of a demodulation signal and the input terminal 101. The output terminal 116 of a demodulation signal is a terminal for outputting demodulated data to a circuit of a next stage.

Note that the node in this specification means an arbitrary point of a wiring at which elements included in a circuit electrically connect to one another. Therefore, "a node to which A is connected" is an arbitrary point which is electrically connected to A and which can be regarded to have the same potential as A.

In FIG. 1, a transistor may be connected instead of the resistor 118. In the case of a transistor, a given bias voltage in accordance with a voltage value of the output terminal 113 of a power supply potential is supplied to a gate terminal so that a current load proportional to a current consumed by a circuit of a next stage, which is a load of the voltage doubler rectifier circuit, can be achieved.

With the circuit configuration of the transmitting and receiving circuit of the present invention, data of a received wireless signal can be extracted with the output terminal 116 of a demodulation signal and a demodulation function can be achieved.

The output terminal 116 of a demodulation signal is connected to a control circuit and a memory circuit of a next stage. In this embodiment mode, by providing a low-pass filter between the output terminal 116 of a demodulation signal and a circuit of a next stage, high-frequency noise due to a carrier wave or the like can be filtered out and a signal with less noise can be supplied to a circuit of a next stage. For the low-pass filter, an optimal characteristic may be selected in accordance with the frequency of a carrier wave to be used.

In this embodiment mode, the diode 114 may be connected between the output terminal 113 of a power supply potential and the output terminal 116 of a demodulation signal. For the diode 114, the potential of the output terminal 116 of a demodulation signal is set to be lower than that of the output terminal 113 of a power supply potential. By providing the diode 114, demodulated data can be correctly supplied to the control circuit and the memory circuit and thus the transmitting and receiving circuit in which malfunctions are reduced can be obtained.

Next, the circuit having a modulation function is described. In order that the voltage doubler rectifier circuit having one stage may be provided with a modulation function, one terminal of the diode 106 is connected between the diode 104 and the capacitor 105 of the voltage doubler rectifier circuit and the other terminal is connected to a drain terminal of the transistor 108. A gate terminal of the transistor 108 is connected to an input terminal 107 of an encoded signal and a source terminal of the transistor 108 is connected to a node having the same potential as the input terminal 101. The input terminal 107 of an encoded signal is connected to the control circuit of a next stage.

The input terminal 107 of an encoded signal is set to have the same potential as the input terminal 101 by the control circuit and thus the transistor 108 is off. Therefore, input impedance of the transmitting and receiving circuit 120 has a certain value.

However, when an encoded signal is inputted to the input terminal 107 of an encoded signal from the control circuit, the state of the transistor 108 is changed by the gate terminal of the transistor 108 in accordance with an encoded signal.

When the transistor 108 is turned on by an encoded signal, a demodulated load current flowing through the transistor 108 is generated. Therefore, input impedance of the transmitting and receiving circuit 120 is different from input impedance while the transistor 108 is off.

That is, input impedance of the transmitting and receiving circuit 120 is changed in accordance with the state of the transistor 108. Further, input impedance of the semiconductor device is changed and thus intensity of a carrier wave from a reader/writer, which is reflected by the semiconductor device, is changed. Since the intensity is changed in accordance with an encoded signal, ASK modulation is achieved and data can be transmitted to the reader/writer.

In FIG. 1, when the transistor 108 is turned on, power is consumed by the diode 106 and the transistor 108. The transmitting and receiving circuit determines the sizes of elements of the diode 106 and the transistor 108 in accordance with an allowable range of fluctuation of a power supply potential and power consumption of a circuit of a next stage, which is connected to the output terminal 113 of a power supply potential. The transmitting and receiving circuit can generate a power supply potential with less fluctuation. Therefore, malfunctions in a circuit of a next stage can be prevented.

In the above description, the voltage doubler rectifier circuit having one stage is used; however, since there is no limitation on the number of stages of the voltage doubler rectifier circuit in the present invention, the number of stages can be freely changed in accordance with a condition. That is, in the present invention, a voltage doubler rectifier circuit having N stages (N is a positive integer), which has the same function, can be configured. In order to specifically compare with the configuration of a conventional transmitting and receiving circuit shown in FIG. 6, the circuit configuration in a case of using a voltage doubler rectifier circuit having two stages (N=2) is described with reference to FIG. 25 and advantages of the present invention is described in detail.

Figure 25:
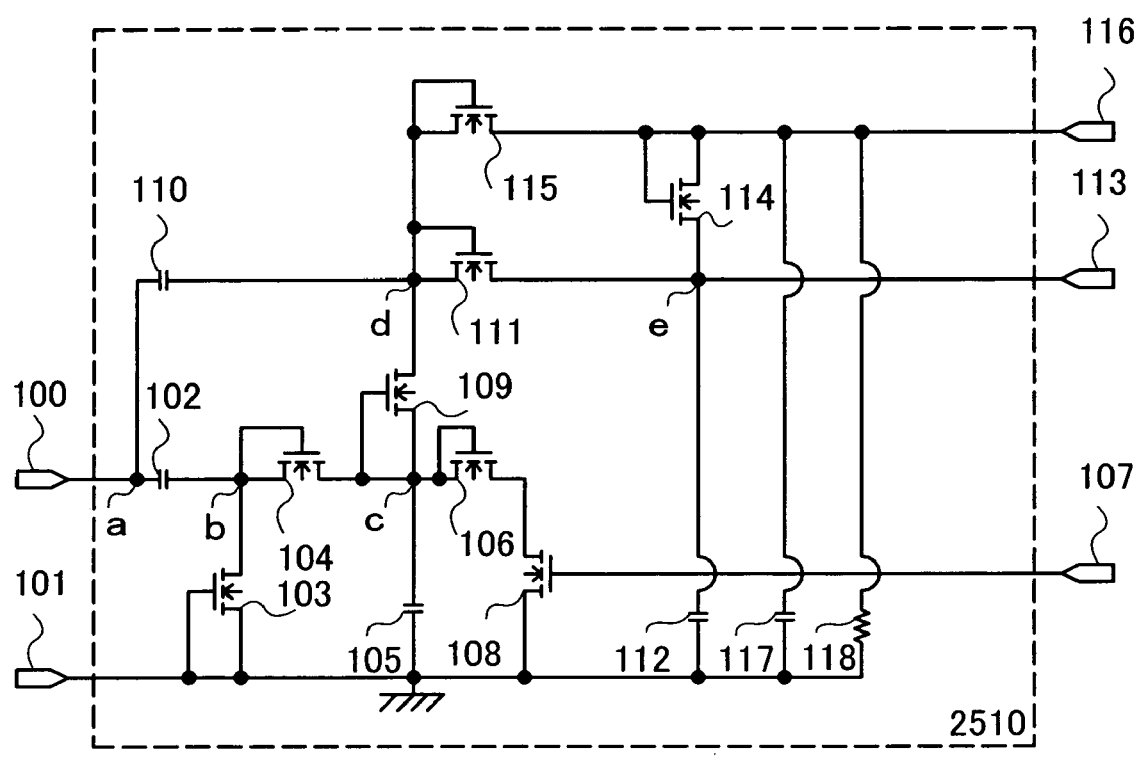
FIG. 25 is a circuit diagram showing a case where a transmitting and receiving circuit of the present invention is configured with an n-channel transistor.

The transmitting and receiving circuit shown in FIG. 25 is a voltage doubler rectifier circuit having two stages, which is provided with a modulation function and a demodulation function. Hereinafter, in the description of FIG. 25, the same reference numeral is used for a structure having a function similar to that in FIG. 1. A different reference numeral is used for only a structure different from that of the transmitting and receiving circuit shown in FIG. 1.

A transmitting and receiving circuit 2510 shown in FIG. 25 includes the input terminal 100 (also referred to as a first input terminal) and the input terminal 101 (also referred to as a second input terminal) which are for connecting with an antenna or an external device. In FIG. 25, in a case where a substrate forming a transistor is a conductor such as a silicon wafer, the input terminal 101 is connected to the substrate and has the same potential as the substrate.

In this embodiment mode, a case where an n-channel transistor is used for the transistor as shown in FIG. 25 is described.

In FIG. 25, a circuit having a rectification function is shown. A first stage of the voltage doubler rectifier circuit having two stages includes the capacitor 102 for detection, which is connected to the input terminal 100, the diode-connected transistor (hereinafter referred to as a diode) 103, the diode 104, and the capacitor for smoothing a received AC signal (smoothing capacitor) 105. One terminal of the capacitor 105 is connected to the input terminal 101 and the other terminal is connected to the diode 104. A second stage of the voltage doubler rectifier circuit having two stages includes the capacitor 110 for detection (detection capacitor), which is connected to the input terminal 100, the diode 109, the diode 111, and the capacitor 112. When a capacitor with higher capacitance than any other capacitor is provided as the capacitor 112 (first capacitor), it is possible to smooth a received AC signal and supply a stabilized power supply potential to a circuit of a next stage. One terminal of the capacitor 112 is connected to the input terminal 101 and the other terminal is connected between the diode 111 and the output terminal 113 of a power supply potential.

Next, the circuit having a demodulation function is described. In order that the voltage doubler rectifier circuit having two stages may be provided with a demodulation function, one terminal of the diode 115 is connected to the detection capacitor 110. The other terminal of the diode 115 is connected to the output terminal 116 of a demodulation signal. The capacitor 117 (second capacitor) and the resistor 118 are connected between nodes having the same potential as the output terminal 116 of a demodulation signal and the input terminal 101. The output terminal 116 of a demodulation signal is a terminal for outputting demodulated data to a circuit of a next stage.

Figure 5:
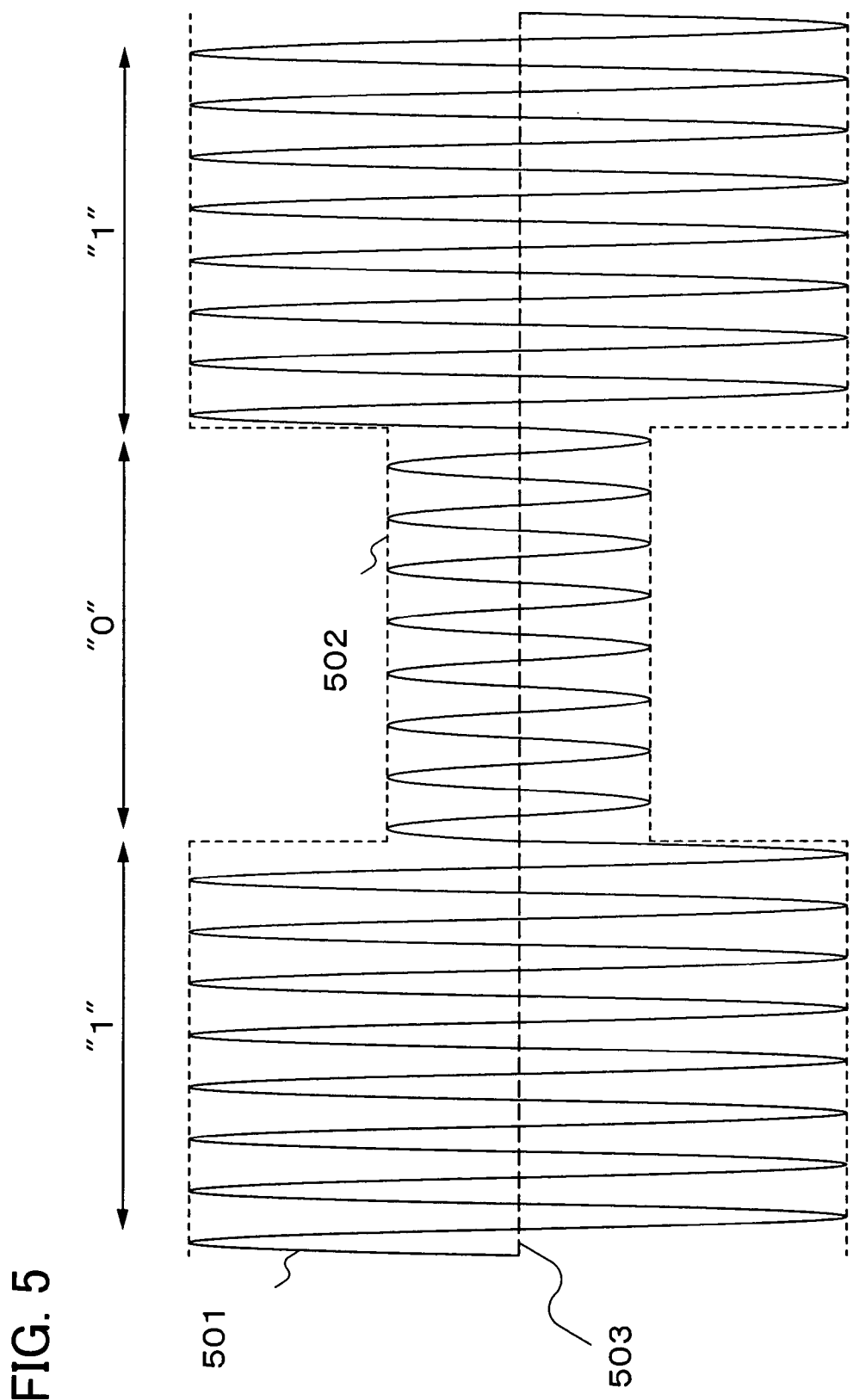
FIG. 5 is a diagram showing a waveform of ASK modulation.

For example, in a case of a wireless signal modulated by such an ASK mode as shown in FIG. 5, fluctuation of amplitude of a carrier wave 501 is data. A signal generated by a reference potential 503 and an envelope curve 502 over or under the reference potential 503 corresponds to data.

Therefore, by the voltage doubler rectifier circuit, a wireless signal is rectified so that only a carrier wave with positive or negative amplitude with respect to the reference potential 503 is left. The carrier wave 501 having only positive or negative amplitude is smoothed by the capacitor 117 and thus, data generated by the envelope line 502 and the reference potential 503 can be obtained.

In FIG. 25, when the capacitor 117 has high capacitance, a charge for charging of the capacitor 117 in a period of data "1" cannot be completely discharged in a period of data "0" and the potential of the output terminal 116 cannot follow amplitude of a carrier wave due to smoothing by the capacitor 117. Accordingly, the period of data "1" gets longer and data generated by the envelope line 502 and the reference line 503 cannot be reproduced. Capacitance of the capacitor 117 is set to be low, that is, 1 to 10 pF so that a charge for charging of the capacitor 117 is completely discharged or resistance of the resistor 118 is set to be 10 to 100 kΩ so that a charge for charging of the capacitor 117 can be easily discharged; therefore, a charge of the capacitor 117 can be discharged and the period of data "0" can be reproduced.

Capacitance of the capacitor 117 and resistance of the resistor 118 have a relation with time in which a potential is changed. When capacitance of the capacitor 117 is C, resistance of the resistor 118 is R, and a time constant is τ, there is a relation expressed by Formula 2. The time constant τ in Formula 2 represents, assuming that the amplitude of data in the period of data "1" is 1 and the amplitude of data in the period of data "0", the passage of time when the changing rate from "1" to "0" is 63%.

$$\tau = RC \qquad \text{[Formula 2]}$$

In FIG. 25, the time constant τ in Formula 2 is set to be equal to or lower than 100 ns so that a charge in the capacitor can be discharged and the amplitude of the carrier wave 501 can be followed. In specific, in order to set the time constant τ to 100 ns, capacitance of the capacitor 117 and resistance of the resistor 118 may be set to 2 pF and 50 kΩ, respectively.

In FIG. 25, a transistor may be connected instead of the resistor 118. In the case of a transistor, a given bias voltage in accordance with a voltage value of the output terminal 113 of a power supply potential is supplied to a gate terminal so that a current load proportional to a current consumed by a circuit of a next stage, which is a load of the voltage doubler rectifier circuit, can be achieved.

With the circuit configuration of the transmitting and receiving circuit of the present invention, which is shown in FIG. 25, data of a received wireless signal can be extracted with the output terminal 116 of a demodulation signal and a demodulation function can be achieved. With the circuit configuration of the present invention in FIG. 25, data generated by the envelope line 502 with respect to the reference potential 503 shown in FIG. 5 can be extracted.

The output terminal 116 of a demodulation signal is connected to a control circuit and a memory circuit of a next stage. In this embodiment mode shown in FIG. 25, by providing a low-pass filter between the output terminal 116 of a demodulation signal and a circuit of a next stage, high-frequency noise due to the carrier wave 501 or the like can be filtered out and a signal with less noise can be supplied to a circuit of a next stage. For the low-pass filter, an optimal characteristic may be selected in accordance with the frequency of a carrier wave to be used.

In the configuration of the transmitting and receiving circuit shown in FIG. 25, the diode 114 may be connected between the output terminal 113 of a power supply potential and the output terminal 116 of a demodulation signal. For the diode 114, the potential of the output terminal 116 of a demodulation signal is set to be lower than that of the output terminal 113 of a power supply potential. This allows demodulated data to be correctly supplied to the control circuit and the memory circuit, and thus the transmitting and receiving circuit in which malfunctions are reduced can be obtained.

Next, the circuit having a modulation function is described. In order that the voltage doubler rectifier circuit having two stages may be provided with a modulation function, one terminal of the diode 106 is connected between the diode 104 and the diode 109 of the voltage doubler rectifier circuit and the other terminal is connected to a drain terminal of the transistor 108. A gate terminal of the transistor 108 is connected to the input terminal 107 of an encoded signal and a source terminal of the transistor 108 is connected to the input terminal 101. The input terminal 107 of an encoded signal is connected to the control circuit of a next stage.

The input terminal 107 of an encoded signal is set to have the same potential as the input terminal 101 by the control circuit and thus the transistor 108 is off. Therefore, input impedance of the transmitting and receiving circuit 2510 has a certain value.

However, when an encoded signal is inputted to the input terminal 107 of an encoded signal from the control circuit, a state of the transistor 108 is changed by the gate terminal of the transistor 108 in accordance with an encoded signal.

When the transistor 108 is turned on by an encoded signal, a demodulated load current flowing through the transistor 108 is generated. Therefore, input impedance of the transmitting and receiving circuit 2510 is different from input impedance while the transistor 108 is off.

That is, input impedance of the transmitting and receiving circuit 2510 is changed in accordance with a state of the transistor 108. Further, input impedance of the semiconductor device is changed and thus intensity of a carrier wave from a reader/writer, which is reflected by the semiconductor device, is changed. Since the intensity is changed in accordance with an encoded signal, ASK modulation is achieved and data can be transmitted to the reader/writer.

As described above, the transmitting and receiving circuit of the present invention can be configured so as to be provided with the same function with the use of fewer elements than a conventional transmitting and receiving circuit. In the above description, the voltage doubler rectifier circuit having two stages is used; however, since there is no limitation on the number of stages of the voltage doubler rectifier circuit in the present invention, the number of stages can be freely changed in accordance with a condition.

Next, extension of a communication distance of the present invention is described.

In general, a rectifier (here, diode) can output only a voltage lower than an input voltage by a threshold voltage; therefore, the threshold voltage $V_{th}$ of the rectifier might be a cause of voltage loss.

Figure 6:
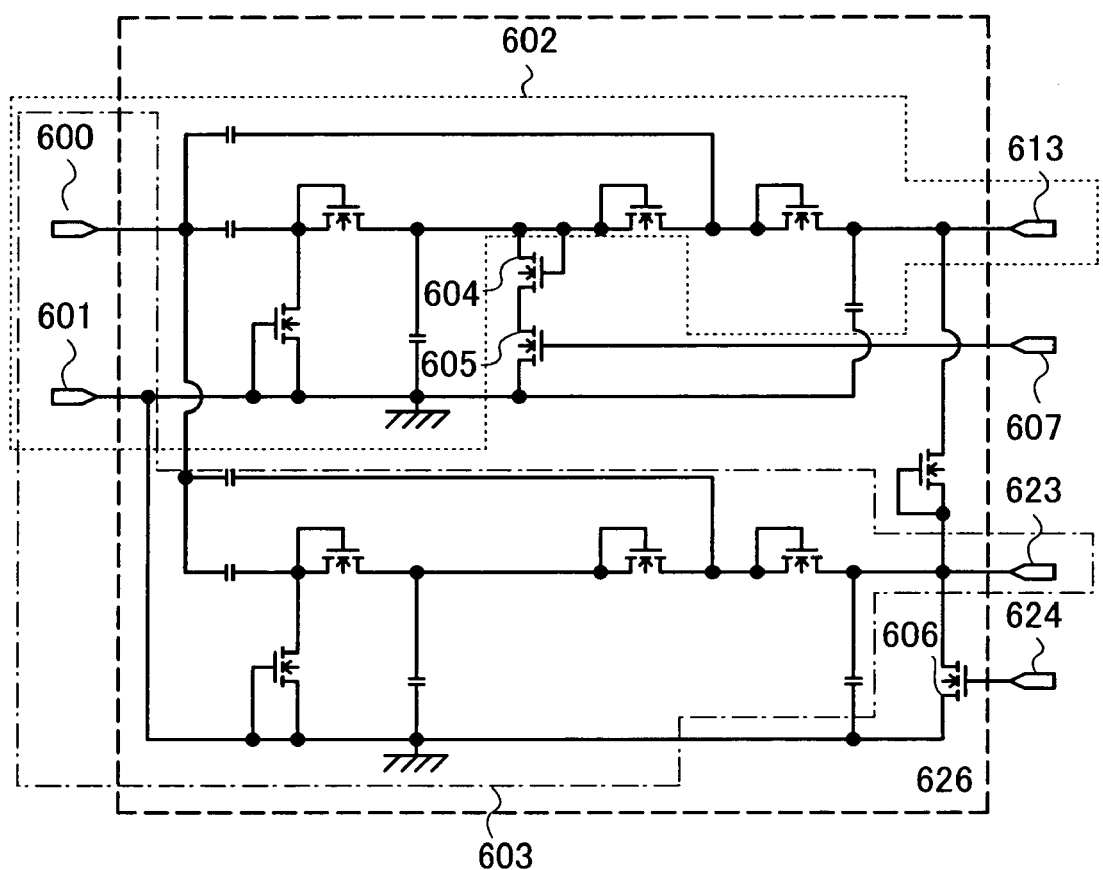
FIG. 6 is a circuit diagram showing the configuration of a conventional transmitting and receiving circuit.

In comparing the conventional circuit configuration shown in FIG. 6 and the circuit configuration of the present invention, portions each having a modulation function are not different from each other. Therefore, only portions other than the portion having a modulation function are described.

In the conventional circuit configuration shown in FIG. 6, a total loss of the transmitting and receiving circuit is threshold voltages $V_{th}$ of 8 diodes, that is, $(8 \times V_{th})$ as described above.

On the other hand, in the conventional circuit configuration of the present invention, which is shown in FIG. 25, 5 diodes are used to achieve a rectification function and a demodulation function; therefore, a total loss of the transmitting and receiving circuit is threshold voltages $V_{th}$ of 5 diodes, that is, $(5 \times V_{th})$ as described above.

In the case of the circuit configuration of the present invention, a voltage loss is less than that of the conventional circuit configuration; therefore, power conversion efficiency can be improved.

Next, a relation between power conversion efficiency and a communication distance is described with reference to FIGS. 7 and 8.

Figure 7:
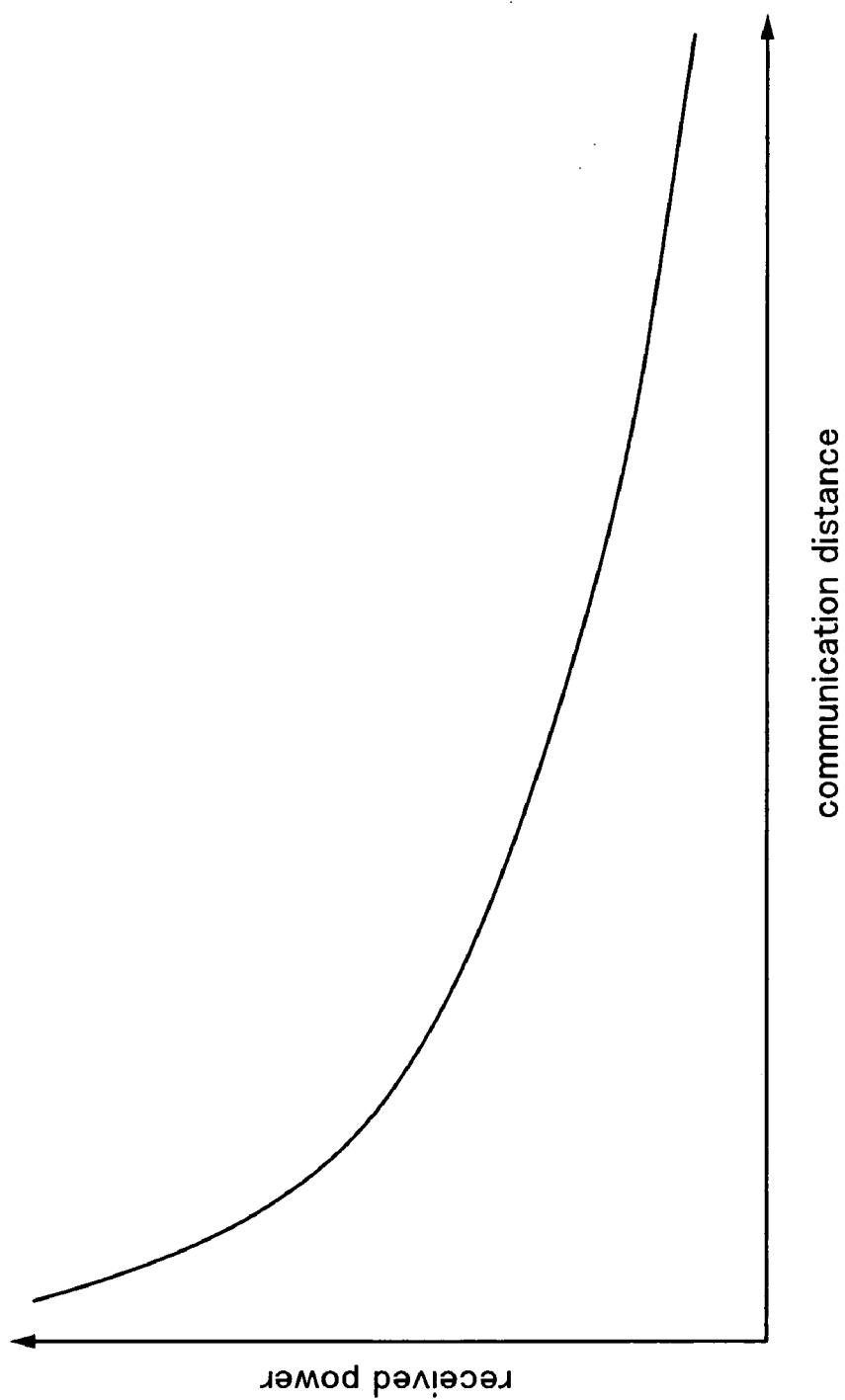
FIG. 7 is a graph showing the relation between a communication distance and received power of an antenna.

FIG. 7 is a graph showing a relation between power received by an antenna of a semiconductor device and a communication distance. It is shown that power which can be received attenuates in proportion to the square of a communication distance.

Figure 8:
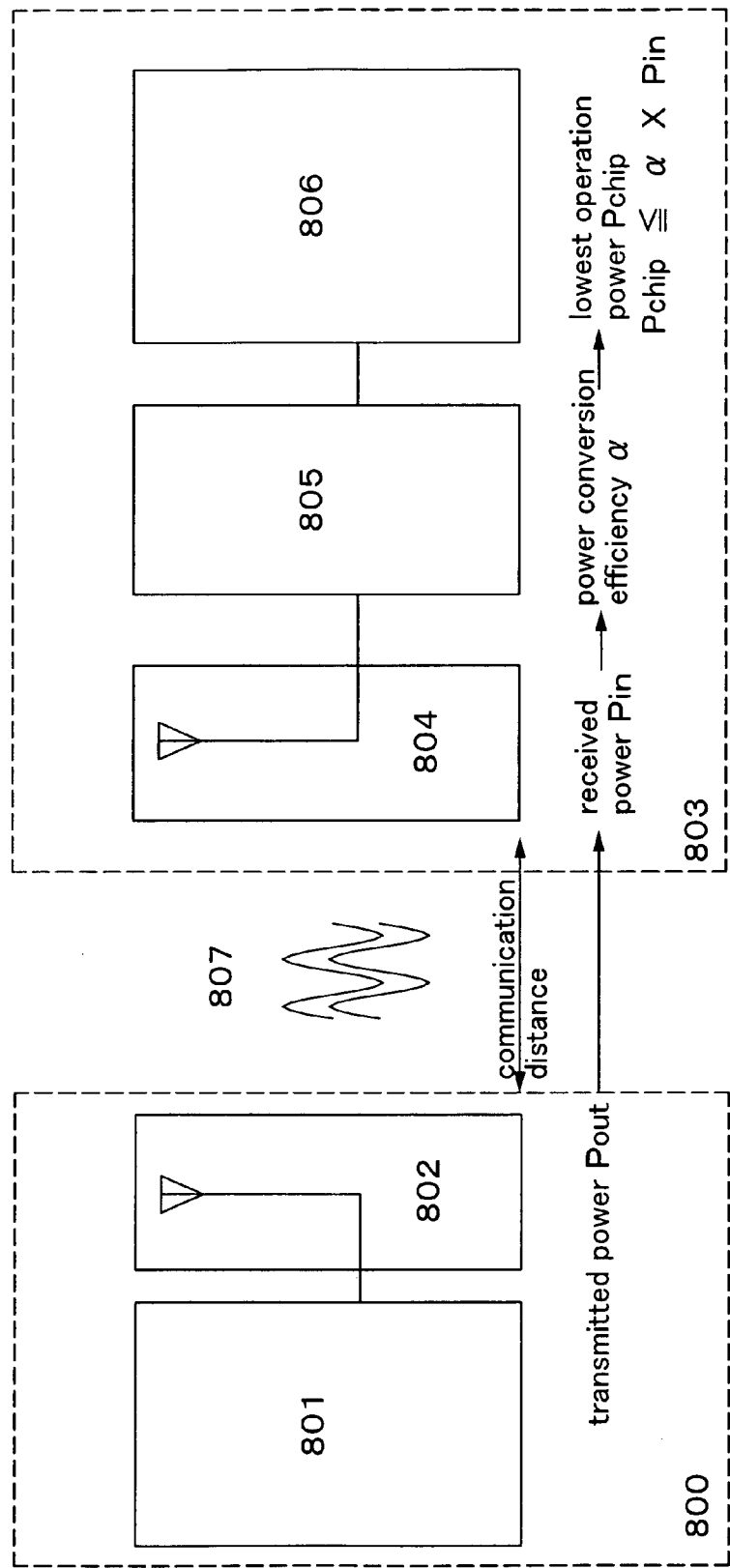
FIG. 8 is a diagram schematically showing the way power is transmitted in a wireless communication system.

FIG. 8 is a diagram schematically showing the way a wireless signal (power) outputted from a reader/writer is transmitted to a semiconductor device and then used in the semiconductor device, in a wireless communication system.

A reader/writer 800 includes a control circuit 801 and an antenna 802.

A semiconductor device 803 includes an antenna 804, a transmitting and receiving circuit 805, and another circuit 806. The antenna 804 receives a wireless signal 807. Here, power to be received by the antenna 804 is $P_{in}$. Power conversion efficiency of the transmitting and receiving circuit 805 is α. The lowest operating power of the circuit 806 is $P_{chip}$.

In such a wireless communication system as shown in FIG. 8, a case is considered where the reader/writer 800 is provided and the semiconductor device 803 is located away from the reader/writer 800. Here, the reader/writer 800 outputs data as a wireless signal 807 through a carrier wave from the antenna 802. The semiconductor device 803 receives the wireless signal 807 with the antenna 804. Here, there is such a relation as shown in FIG. 7 between the wireless signal 807 received by the antenna 804 and the communication distance between the reader/writer 800 and the semiconductor device 803; therefore, received power $P_{in}$ of the semiconductor device 803 is determined by the communication distance. On the other hand, the transmitting and receiving circuit 805 supplies a DC voltage to the circuit 806 with the use of the received power $P_{in}$. The circuit 806 operates with the use of the DC power. Here, the circuit 806 does not operate until the DC power equal to or higher than the lowest operating power $P_{chip}$ is supplied thereto. Power to be supplied to the circuit 806 is determined by the product of the received power $P_{in}$ and the power conversion efficiency α. Therefore, operation of the semiconductor device 803 depends on the communication distance and the power conversion efficiency α. As the communication distance is longer, $P_{in}$ is lower. However, if the power conversion efficiency α can be improved and power equal to or higher than the lowest operating power $P_{chip}$ can be supplied to the circuit 806, the circuit 806 can operate even when the communication distance is extended. Therefore, the communication distance of the semiconductor device 803 can be extended.

In the case of the transmitting and receiving circuit of the present invention, a communication distance can be extended by improvement of the power conversion efficiency α.

Note that in this embodiment mode, operation of the transmitting and receiving circuit in receiving a wireless signal is described; however, the present invention can also be applied to a transmitting and receiving circuit to which a wired signal is inputted. That is, the transmitting and receiving circuit having the configuration of this embodiment mode also functions as a transmitting and receiving circuit for modulation, demodulation, or the like based on the wired signal and brings a similar effect.

In the present invention, since the transmitting and receiving circuit can be formed of fewer transistors, it can be reduced in size. Since the transmitting and receiving circuit of the present invention can prevent a reduction in power conversion efficiency, a power supply potential can be efficiently generated and the communication distance from an external communication device can be extended. Further, the transmitting and receiving circuit of the present invention can be reduced in size by an amount proportional to how much the number of elements included in the transmitting and receiving circuit is reduced by, and thus the cost can be reduced.

Embodiment Mode 2

In this embodiment mode, a transmitting and receiving circuit having a different configuration from the transmitting and receiving circuit described in Embodiment Mode 1 is described.

In the description using FIG. 1 in Embodiment Mode 1, a circuit configuration using an n-channel transistor is described. According to the present invention, a circuit having a similar function can also be configured using a p-channel transistor. In this embodiment mode, the circuit configuration using a p-channel transistor is shown in FIG. 2.

Figure 2:
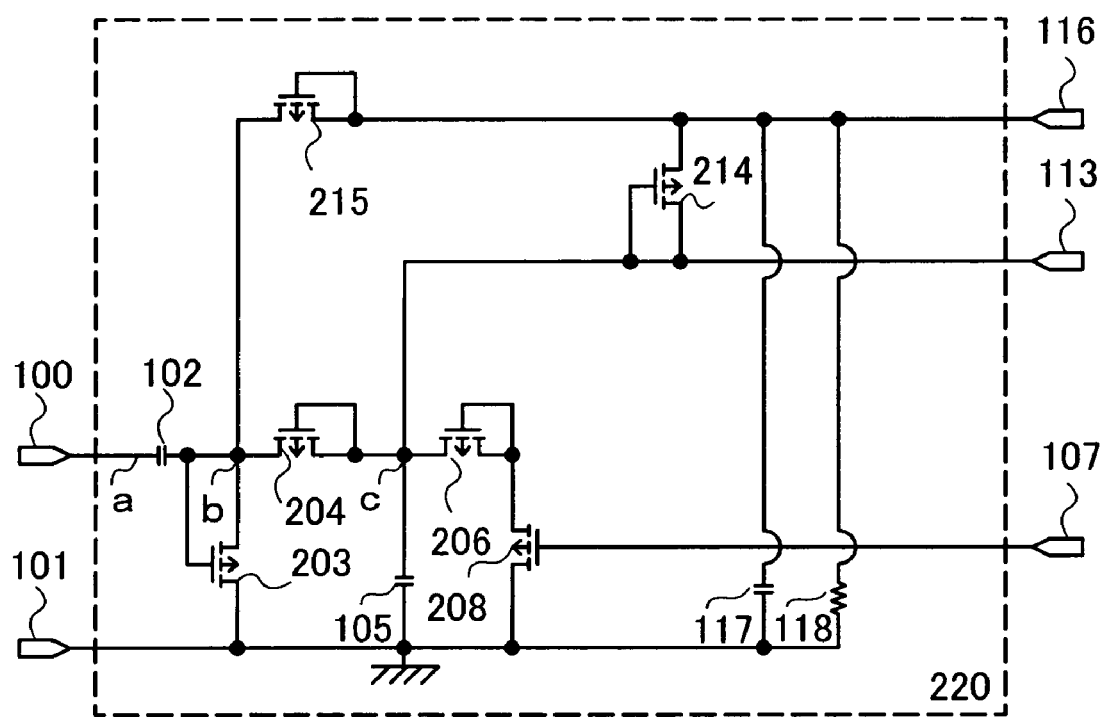
FIG. 2 is a circuit diagram showing a case where a transmitting and receiving circuit of the present invention is configured with a p-channel transistor.

FIG. 2 differs from FIG. 1 in that a transmitting and receiving circuit 220 configured with a p-channel transistor is used instead of the transmitting and receiving circuit 120 configured with an n-channel transistor, which is shown in FIG. 1. Here, only portions which differ from those in the transmitting and receiving circuit in FIG. 1 are described.

The configuration described in this embodiment mode is different from the configuration in FIG. 1, which is described in Embodiment Mode 1, in that a portion to which a gate terminal of a diode is connected is a terminal on a side different from that of the diode using an n-channel transistor as shown in FIG. 2. According to the present invention, by changing connection of a gate terminal, a diode which performs the same operation as the diode configured with an n-channel transistor can be configured even with a p-channel transistor.

A difference between the configuration described in this embodiment mode and the configuration in FIG. 1 is a signal which is inputted to the input terminal 107 of an encoded signal. The n-channel transistor 108 in FIG. 1, which is described in Embodiment Mode 1, is turned on and supplies a modulated load current when a potential higher than the potential of the input terminal 101 is inputted to the input terminal 107 of an encoded signal, which is the gate terminal of the n-channel transistor 108. On the other hand, a p-channel transistor 208 in FIG. 2, which is described in this embodiment mode, is turned on and supplies a modulated load current when a potential lower than the potential between a diode 206 and the p-channel transistor 208 is inputted to the input terminal 107 of an encoded signal, which is the gate terminal of the p-channel transistor 208.

Therefore, in the case where the circuit of the present invention is configured with a p-channel transistor, as a signal which is inputted to the input terminal 107 of an encoded signal from a control circuit, it is necessary to input an inverted signal of a signal which is inputted in the case where the circuit is configured with an n-channel transistor.

In the description using FIG. 25 in Embodiment Mode 1, the circuit configuration of the transmitting and receiving circuit 2510 using an n-channel transistor is described. According to the present invention, a circuit having a similar function can also be configured using a p-channel transistor. In this embodiment mode, the circuit configuration of a transmitting and receiving circuit 2620 using a p-channel transistor is shown in FIG. 26.

Figure 26:
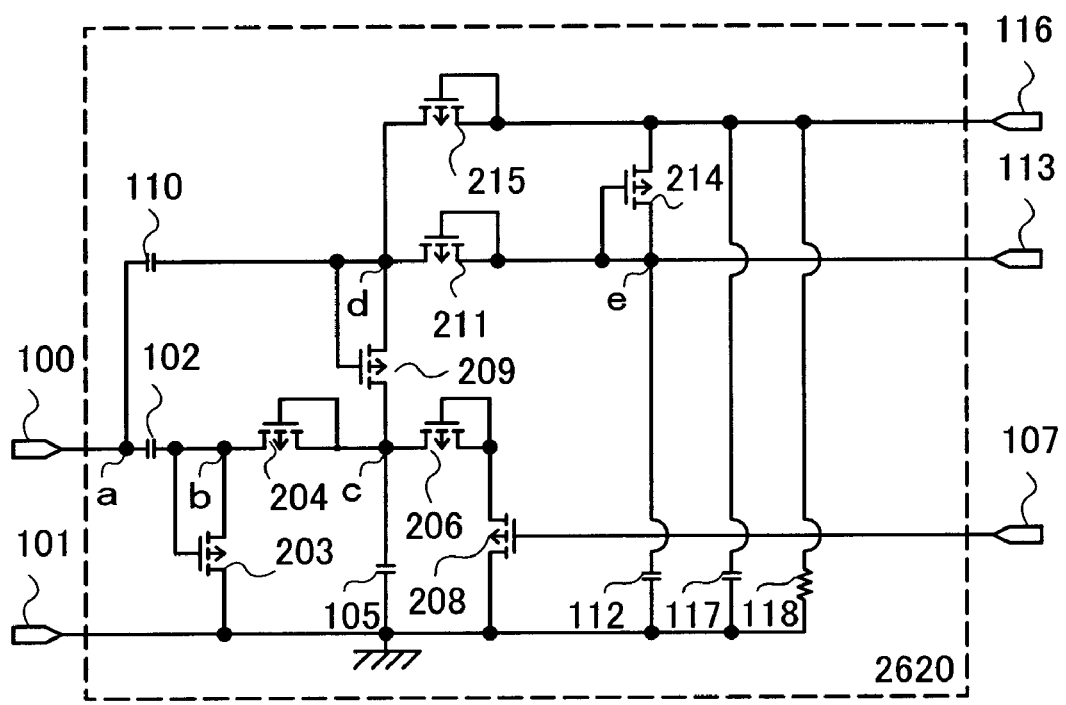
FIG. 26 is a circuit diagram showing a case where a transmitting and receiving circuit of the present invention is configured with a p-channel transistor.

First, a portion to which a gate terminal of a diode is connected is a terminal on a side different from that of the diode using an n-channel transistor as shown in FIG. 26. According to the present invention, by changing connection of a gate terminal, a diode which performs the same operation as the diode configured with an n-channel transistor can be configured even with a p-channel transistor.

A difference between the configuration described in this embodiment mode and the configuration in FIG. 25 described in Embodiment Mode 1 is a signal which is inputted to the input terminal 107 of an encoded signal. The n-channel transistor 108 in FIG. 25, which is described in Embodiment Mode 1, is turned on and supplies a modulated load current when a potential higher than the potential of the input terminal 101 is inputted to the input terminal 107 of an encoded signal, which is the gate terminal of the n-channel transistor 108. On the other hand, the p-channel transistor 208 in FIG. 26, which is described in this embodiment mode, is turned on and supplies a modulated load current when a potential lower than the potential between the diode 206 and the p-channel transistor 208 is inputted to the input terminal 107 of an encoded signal, which is the gate terminal of the p-channel transistor 208.

Therefore, in the case where the circuit of the present invention is configured with a p-channel transistor, as a signal which is inputted to the input terminal 107 of an encoded signal from a control circuit, it is necessary to input an inverted signal of a signal which is inputted in the case where the circuit is configured with an n-channel transistor.

As described above, there are two differences between the case of using an n-channel transistor and the case of using a p-channel transistor. By adjusting the two differences, the transmitting and receiving circuit of the present invention can be achieved even with a p-channel transistor.

Note that this embodiment mode can be implemented in combination with a technical element of any of the other embodiment modes in this specification. That is, since the transmitting and receiving circuit of the present invention can be formed of fewer transistors without impairing the function thereof, it can be reduced in size. Since the transmitting and receiving circuit of the present invention can prevent a reduction in power conversion efficiency, a power supply potential can be efficiently generated. Further, the transmitting and receiving circuit of the present invention can be reduced in size by an amount proportional to how much the number of elements included in the transmitting and receiving circuit is reduced by, and thus the cost can be reduced.

Embodiment Mode 3

In this embodiment mode, a transmitting and receiving circuit having a different configuration from the transmitting and receiving circuits described in Embodiment Modes 1 and 2 is described with reference to FIGS. 3 and 4.

Figure 3:
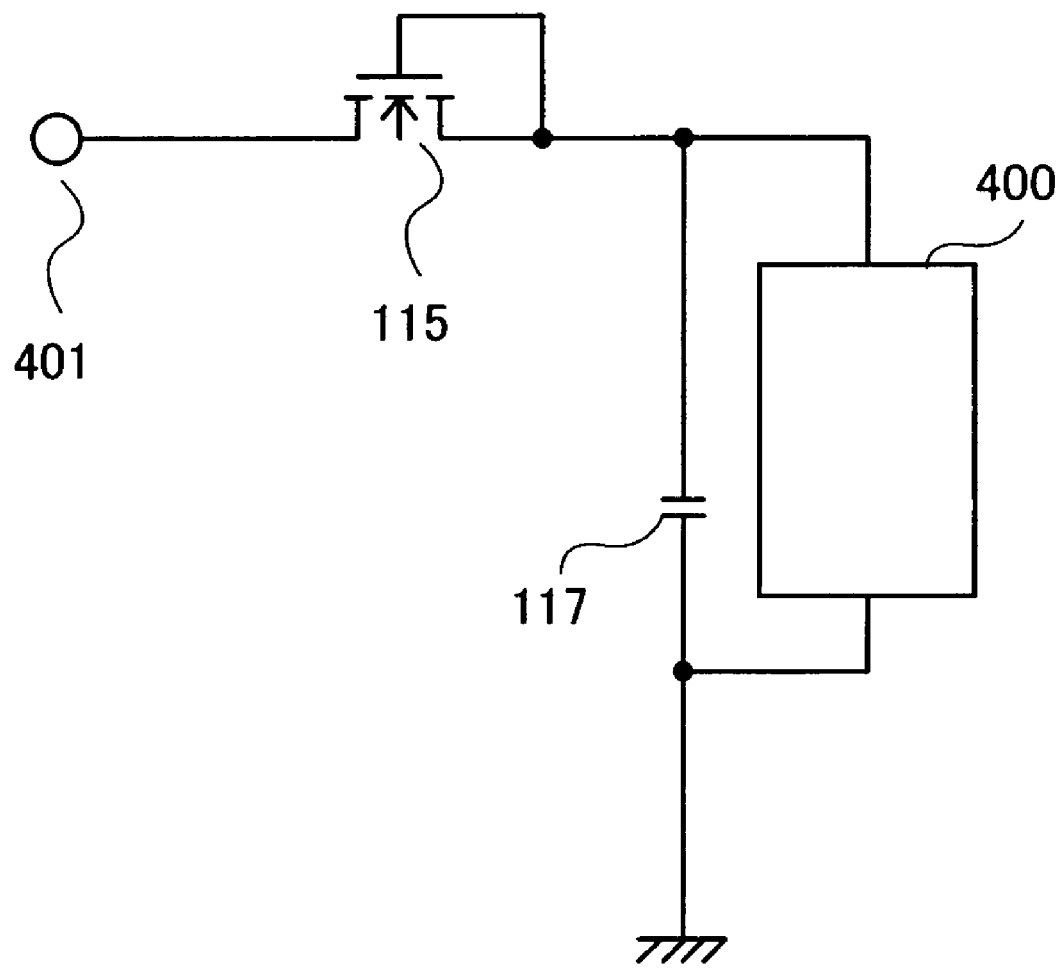
FIG. 3 is a circuit diagram showing a circuit configuration for achieving a demodulation function of a transmitting and receiving circuit of the present invention.

FIG. 3 is a circuit diagram showing only an element for achieving a demodulation function in FIG. 25, which is described in Embodiment Mode 1. The circuit diagram in FIG. 3 includes the diode 115, the capacitor 117, and a load 400. Here, the diode 115 and the capacitor 117 operate in a similar manner to those described in Embodiment Mode 1. Further, similarly to Embodiment Mode 2, the diode 115 using an n-channel transistor can be substituted with a diode 215 using a p-channel transistor. In this embodiment mode, the resistor 118 is used as the load 400. Alternatively, a transistor may be used as the load 400 as long as it supplies a certain amount of DC current.

In the case of a transistor, a given bias voltage which corresponds to a voltage of the output terminal 113 of a power supply potential is supplied to a gate terminal, so that the transistor can have a similar function to the load 400.

Further, in the circuit configuration in FIG. 25, which is described in Embodiment Mode 1, a terminal 401 in FIG. 3 is connected to a node "d". Alternatively, the terminal 401 may be connected to a node "b" or a node "c".

Figure 4:
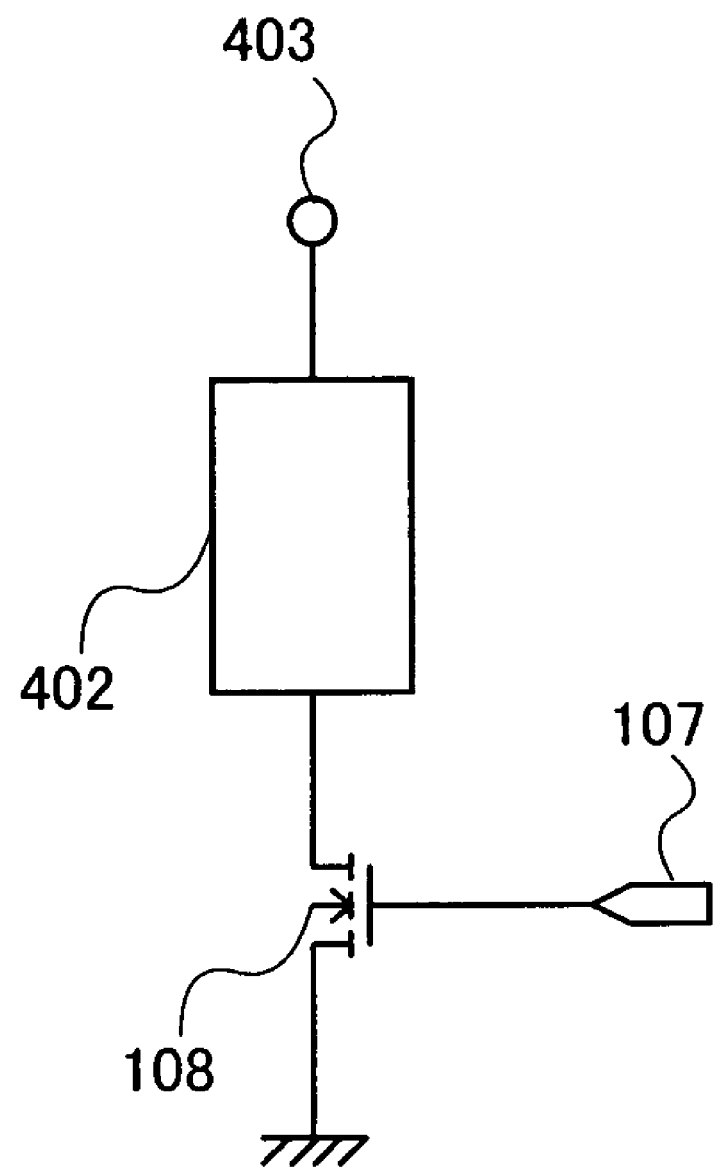
FIG. 4 is a circuit diagram showing a circuit configuration for achieving a modulation function of a transmitting and receiving circuit of the present invention.

FIG. 4 is a circuit diagram showing only an element for achieving a demodulation function in FIG. 25, which is described in Embodiment Mode 1. The circuit diagram in FIG. 4 includes a load 402, the n-channel transistor 108, and the input terminal 107 of an encoded signal. Here, the n-channel transistor 108 operates in a similar manner to that described in Embodiment Mode 1. Further, similarly to Embodiment Mode 2, the n-channel transistor 108 can be substituted with the p-channel transistor 208. In this embodiment mode, the diode 106 using an n-channel transistor or the diode 206 using a p-channel transistor is used as the load 402. Alternatively, a resistor or a capacitor may be used as the load 402 as long as it supplies a DC current or an AC current so that impedance of the transmitting and receiving circuit is changed. When a resistor is used as the load 402, a DC current and an AC current can be supplied. When a capacitor is used as the load 402, an AC current can be supplied. Thus, the load 402 can be achieved.

Further, in the circuit configuration in FIG. 25, which is described in Embodiment Mode 1, a terminal 403 in FIG. 4 is connected to a node "c". Alternatively, the terminal 403 may be connected to a node "a", "b", "d", or "e" when the load 402 is a diode or a resistor. On the other hand, when the load 402 is a capacitor, the terminal 403 may be connected to a node "a", "b", or "d".

Note that this embodiment mode can be implemented in combination with a technical element of any of the other embodiment modes in this specification. That is, since the transmitting and receiving circuit of the present invention can be formed of fewer transistors without impairing the function thereof, it can be reduced in size. Since the transmitting and receiving circuit of the present invention can prevent a reduction in power conversion efficiency, a power supply potential can be efficiently generated. Further, the transmitting and receiving circuit of the present invention can be reduced in size by an amount proportional to how much the number of elements included in the transmitting and receiving circuit is reduced by, and thus the cost can be reduced.

Embodiment 1

In this embodiment, the structure and operation of the semiconductor device including the transmitting and receiving circuit of the present invention is described.

Figure 10:
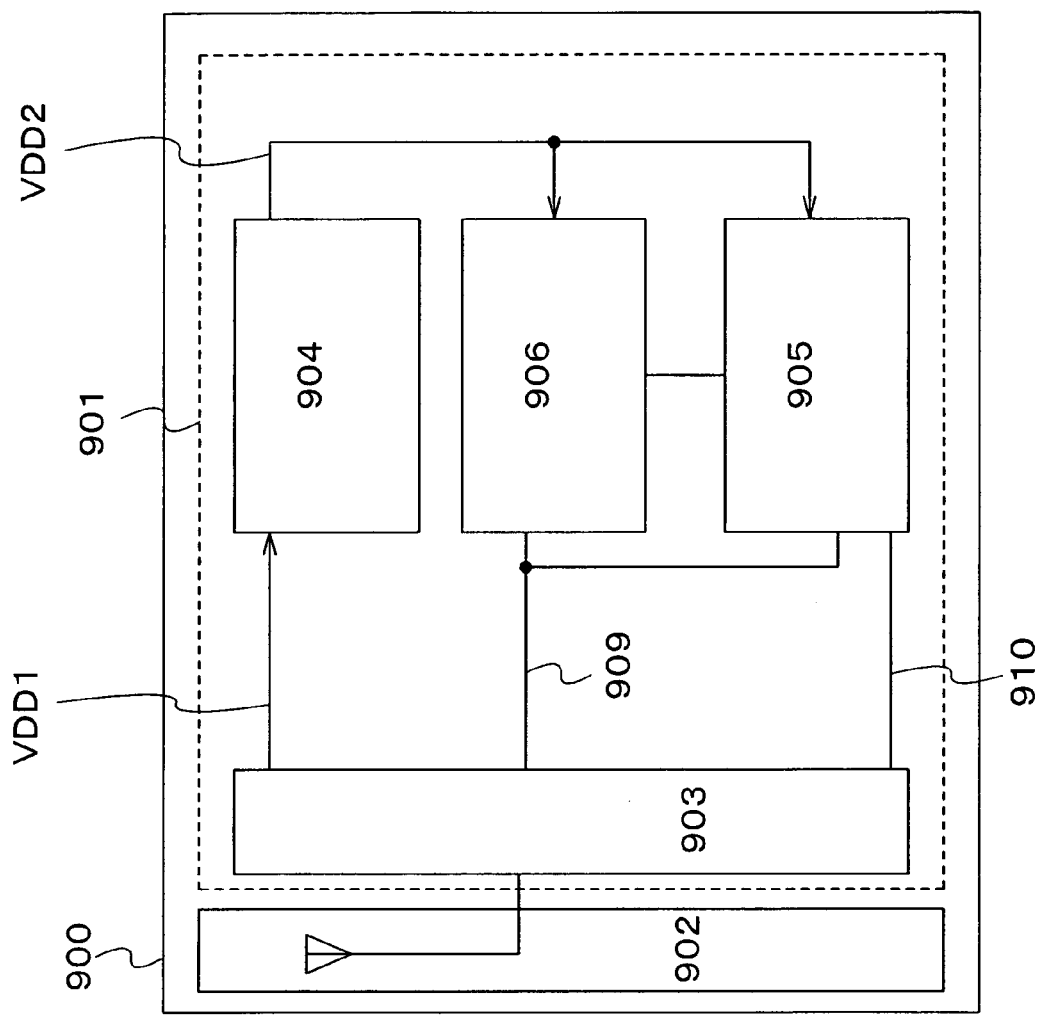
FIG. 10 is a block diagram showing the structure of a semiconductor device of the present invention.

The internal structure of the semiconductor device including the transmitting and receiving circuit of the present invention is described with reference to FIG. 10. FIG. 10 is a block diagram of the inside of the semiconductor device using the transmitting and receiving circuit of the present invention. A semiconductor device 900 of the present invention includes an antenna 902 and a semiconductor integrated circuit 901. The semiconductor integrated circuit 901 includes a transmitting and receiving circuit 903, a power supply circuit 904, a control circuit 905, and a memory circuit 906.

Next, operation of the semiconductor device including the transmitting and receiving circuit of the present invention is described with reference to FIGS. 10 and 12. As shown in FIG. 12, a signal (wireless signal) obtained by modulation of a carrier wave is transmitted from an antenna unit 921 which is connected to a control terminal 922 through a reader/writer 920. Here, the wireless signal includes an instruction from the reader/writer 920 to the semiconductor device 900.

In FIG. 10, the antenna 902 included in the semiconductor device 900 receives the wireless signal. Then, the received wireless signal is transmitted to each circuit block through the transmitting and receiving circuit 903 which is connected to the antenna 902. The power supply circuit 904, the control circuit 905, and the memory circuit 906 are connected to the transmitting and receiving circuit 903.

A first high power supply potential (VDD1) and a second high power supply potential (VDD2) are generated by a rectification function of the transmitting and receiving circuit 903 and the power supply circuit 904, respectively. In this embodiment, VDD2 of the two high power supply potentials is supplied to each circuit block. Note that in this embodiment, a low power supply potential (VSS) is common. Here, the power supply circuit 904 is configured with a constant voltage circuit.

The rectification function of the transmitting and receiving circuit 903 and operation of the power supply circuit 904 are briefly described. For example, a case is considered where the rectification function of the transmitting and receiving circuit 903 is configured with one rectifier circuit and the power supply circuit 904 is configured with a constant voltage circuit. Here, as a rectifier circuit performing a rectification function, the transmitting and receiving circuit of the present invention can be used. The wireless signal transmitted to the transmitting and receiving circuit 903 through the antenna 902 is inputted to the rectifier circuit and rectified. Then, the rectified wireless signal is smoothed by a capacitor of the rectifier circuit and thus the first high power supply potential (VDD1) is generated. The generated VDD1 passes through the constant voltage circuit to be a stable voltage (the second high power supply potential, VDD2) lower than an input voltage. VDD2 which is an output voltage of the constant voltage circuit is supplied as a power supply voltage to each circuit block. Note that the generated VDD1 may be supplied as power to each circuit block. Further, both VDD1 and VDD2 may be supplied to each circuit block. It is desirable that whether VDD1 or VDD2 is supplied be determined depending on the operating condition and the usage of each circuit block.

Here, the constant voltage circuit has a function of stabilizing a DC voltage and may be any circuit which can stabilize a DC voltage by using a voltage, a current, or both a voltage and a current.

A demodulation signal 909 is generated by a demodulation function of the transmitting and receiving circuit 903. The generated demodulation signal 909 is supplied to each circuit block. In this embodiment, a demodulation function can be achieved by using the transmitting and receiving circuit described in any of the above embodiment modes.

The transmitting and receiving circuit 903 and the control circuit 905 are connected to each other and the demodulation signal 909 generated by the transmitting and receiving circuit 903 is supplied to the control circuit 905.

The control circuit 905 includes a reset circuit. A reset signal is generated by the reset circuit. The reset signal is a signal for resetting the semiconductor device 900.

The control circuit 905 includes a clock generating circuit. A basic clock signal is generated by the clock generating circuit based on the demodulation signal 909 transmitted through the transmitting and receiving circuit 903. The basic clock signal generated by the clock generating circuit is used in a circuit in the control circuit.

Further, the control circuit 905 extracts and identifies an instruction transmitted to the semiconductor device 900 from the reader/writer 920 from the demodulation signal 909 transmitted through the transmitting and receiving circuit 903. The control circuit 905 also has a role of controlling the memory circuit 906.

Thus, the instruction transmitted from the reader/ writer 920 is identified and the memory circuit 906 is operated by the identified instruction. Then, a signal which includes specific data such as the ID number stored or written in the memory circuit 906 is outputted. Alternatively, information transmitted from the reader/writer 920 is stored in the memory circuit 906.

Here, for the memory circuit 906, a DRAM (dynamic random access memory), an SRAM (static random access memory), an FeRAM (ferroelectric random access memory), a mask ROM (read only memory), an EPROM (electrically programmable read only memory), an EEPROM (electrically erasable and programmable read only memory), or a flash memory can be used.

Further, the control circuit 905 has also a role of converting a signal including specific data such as the ID number stored or written in the memory circuit 906 into a signal encoded by an encoding method which meets a standard such as ISO. A signal transmitted to the antenna 902 is modulated by the transmitting and receiving circuit 903 in accordance with an encoded signal 910.

The modulated signal is received by the antenna unit 921 connected to the reader/writer 920. Then, the received signal is analyzed by the reader/writer 920 and thus the specific data of the semiconductor device 900, such as the ID number, can be identified.

Thus, communication is performed between the semiconductor device 900 and the reader/writer 920 by modulation of a carrier wave. The frequency of the carrier wave is, depending on a standard, 125 kHz, 13.56 MHz, 950 MHz, or the like. A demodulation method is, depending on a standard, amplitude modulation, frequency modulation, phase modulation, or the like; however, any modulation method may be used as long as it meets a standard.

Signal transmission methods can be categorized into an electromagnetic coupling method, an electromagnetic induction method, a microwave method, and the like in accordance with the wavelength of a carrier wave.

In this embodiment, the structure of the semiconductor device 900 including the antenna 902 is described; however, the semiconductor device of the present invention does not necessarily include an antenna.

In the present invention, "connected" means "electrically connected". Therefore, another element or the like may be provided between certain portions which are connected.

Note that this embodiment can be implemented in combination with a technical element of any of the other embodiment modes in this specification. That is, regarding the semiconductor device of this embodiment, the transmitting and receiving circuit can be formed of fewer transistors without impairing the function of the transmitting and receiving circuit. Therefore, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

Embodiment 2

In this embodiment, the structure and operation of the semiconductor device of the present invention which is provided with a battery is mounted are described.

Figure 11:
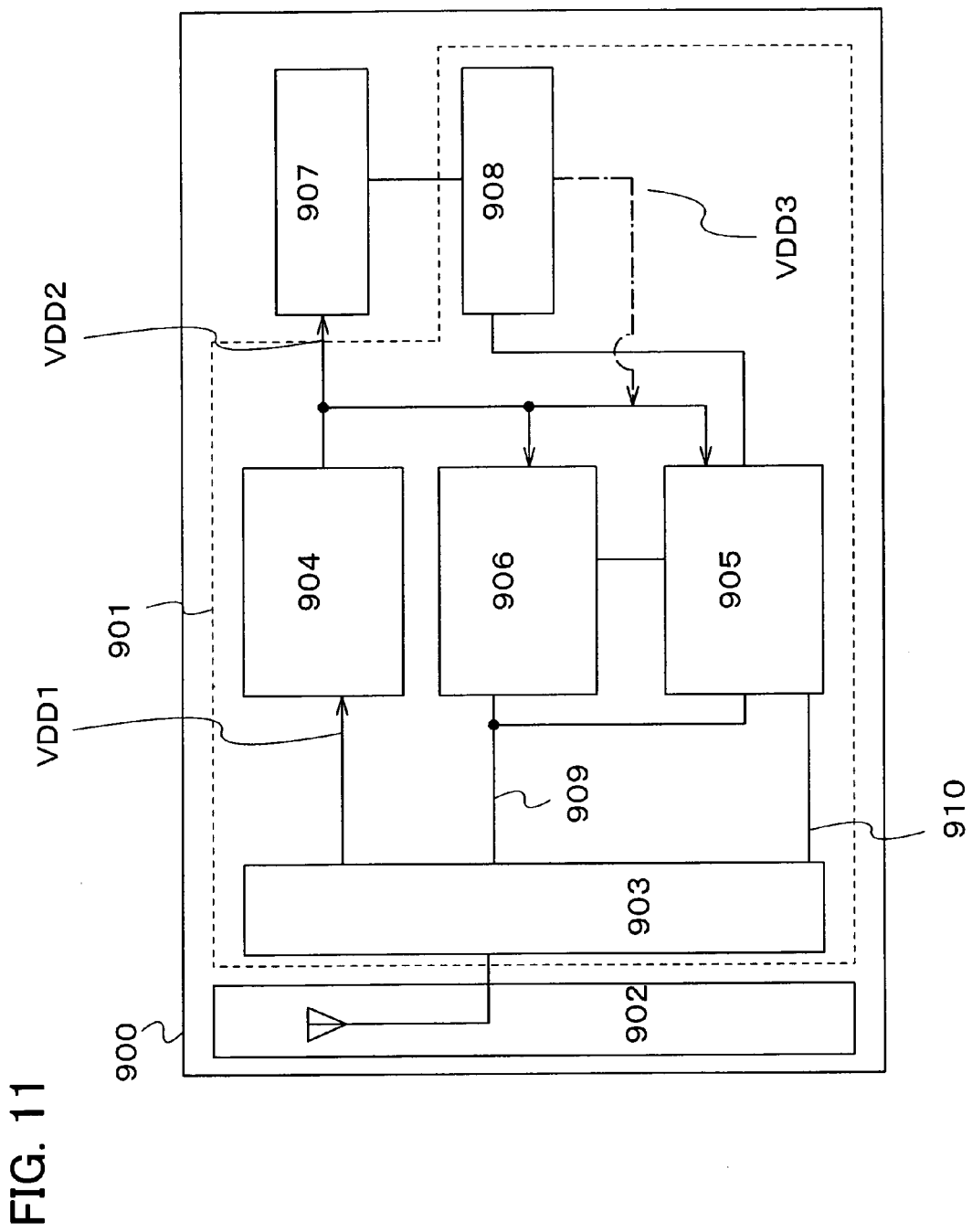
FIG. 11 is a block diagram showing the structure of the semiconductor device of the present invention.

First, the structure of the semiconductor device including the transmitting and receiving circuit of the present invention which is provided with a battery is described with reference to FIG. 11. The semiconductor device 900 of the present invention includes the antenna 902 and the semiconductor integrated circuit 901. The semiconductor integrated circuit 901 includes the transmitting and receiving circuit 903, the power supply circuit 904, the first control circuit 905, the memory circuit 906, and a second control circuit 908. The semiconductor device 900 also includes a battery 907.

Next, operation of the semiconductor device of the present invention which is provided with a battery is described with reference to FIGS. 11 and 12. Here, a battery refers to a power unit capable of being charged, such as a secondary battery. Note that in FIG. 11, structures which have the same functions as those in FIG. 10, described in Embodiment Mode 1, are given the same reference numerals as the structures in FIG. 10, and description thereof is omitted.

The function and operation of the battery 907 mounted to the semiconductor device 900 are described below.

The battery 907 is electrically connected to the power supply circuit 904 and the second control circuit 908.

The battery 907 is charged by VDD1 from the transmitting and receiving circuit 903 or VDD2 from the power supply circuit 904. A charge supplied by VDD1 or VDD2 is stored in the battery 907.

The second control circuit 908 controls operation of the battery 907 to generate a third high power supply potential (VDD3). In this embodiment, the second control circuit 908 may be connected to at least one of circuit blocks included in the semiconductor device 900 of the present invention.

The second control circuit 908 does not operate when VDD2 supplied to each circuit block is high enough to operate each circuit block. The second control circuit 908 operates when VDD2 supplied to each circuit block is not high enough to operate each circuit block, and the second control circuit 908 has a function of supplying VDD3 to each circuit block by controlling the battery 907. With power from the battery 907 controlled by the second control circuit 908, transmission and reception become possible between the antenna unit 921 connected to the reader/writer 920 and the semiconductor device 900 which is provided with the battery 907.

Here, as an example of the case where VDD2 supplied to each circuit block is not high enough to operate each circuit block, a case where the distance between the antenna unit 921, which is electrically connected to the reader/writer 920, and the semiconductor device 900, which is provided with the battery 907, is long is given. If the distance is long, transmission and reception of a signal are difficult. However, in the case where the battery is mounted, the battery is charged while transmission and reception are performed and power is supplied from the battery in the case where transmission and reception are difficult, so that transmission and reception are possible even if the distance is long.

Note that the case where VDD2 supplied to each circuit block is not high enough to operate each circuit block is not limited to the above-described example.

In a wireless communication system using the semiconductor device 900 which is provided with the battery 907, the semiconductor device 900 which is provided with the battery 907, the antenna unit 921 which is connected to the reader/writer 920 which has a known structure, and the control terminal 922 for controlling the reader/writer 920 can be used. The semiconductor device 900 which is provided with the battery 907 and the antenna unit 921 which is connected to the reader/writer 920 communicate by one-way communication or two-way communication, employing any one of a space division multiplex method, a polarization division multiplex method, a frequency division multiplex method, a time division multiplex method, a code division multiplex method, and an orthogonal frequency division multiplex method.

A wireless signal is a signal obtained by modulation of a carrier wave. A carrier wave may be modulated by either analog modulation or digital modulation, and any one of amplitude modulation, phase modulation, frequency modulation, and spread spectrum modulation may be employed.

For the frequency of a carrier wave, any of the following may be employed: 300 GHz to 3 THz, which is the frequency of a submillimeter wave; 30 GHz to 300 GHz, which is the frequency of a millimeter wave; 3 GHz to 30 GHz, which is the frequency of a microwave; 300 MHz to 3 GHz, which is the frequency of an ultrahigh frequency wave; 30 MHz to 300 MHz, which is the frequency of a very high frequency wave;

3 MHz to 30 MHz, which is the frequency of a short wave; 300 kHz to 3 MHz, which is the frequency of a medium wave; 30 kHz to 300 kHz, which is the frequency of a long wave; and 3 kHz to 30 kHz, which is the frequency of a very low frequency wave.

As each of the antenna 902 and the antenna unit 921, any one of a dipole antenna, a patch antenna, a loop antenna, and a Yagi antenna can be used. A wireless signal may be transmitted and received by the antenna 902 and the antenna unit 921 by using any one of an electromagnetic coupling method, an electromagnetic induction method, and a radio wave method.

In the present invention, "connected" means "electrically connected". Therefore, another element or the like may be provided between elements which are connected.

Note that this embodiment can be implemented in combination with a technical element of any of the other embodiment modes in this specification. That is, regarding the semiconductor device of this embodiment, the transmitting and receiving circuit can be formed of fewer transistors without impairing the function of the transmitting and receiving circuit. Therefore, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

Embodiment 3

In this embodiment, an example of the method for manufacturing the semiconductor device described in Embodiment 2 is described with reference to the drawings. In this embodiment, a structure in which an antenna, a battery, and a semiconductor integrated circuit in the semiconductor device are formed over one substrate by using a thin film transistor is described. Note that reduction in size can be achieved by forming an antenna, a battery, and a semiconductor integrated circuit over one substrate, which is preferable. An example where a thin film secondary battery is used as a battery is described.

First, a release layer 1303 is formed over a surface of a substrate 1301 with an insulating film 1302 interposed therebetween. Then, an insulating film 1304 functioning as a base film and a semiconductor film 1305 (for example, a film containing amorphous silicon) are stacked (see FIG. 13A). Note that the insulating film 1302, the release layer 1303, the insulating film 1304, and the semiconductor film 1305 can be sequentially formed.

As the substrate 1301, a glass substrate, a quartz substrate, a metal substrate (such as a stainless steel substrate), a ceramic substrate, or a semiconductor substrate such as a silicon substrate can be used. Alternatively, a substrate formed of polyethylene terephthalate (PET), polyethylene naphthalate (PEN), polyether sulfone (PES), acrylic, or the like can be used as a plastic substrate. Note that in this step, the release layer 1303 is provided over an entire surface of the substrate 1301 with the insulating film 1302 interposed therebetween; however, the release layer 1303 may be selectively provided by a photolithography method as necessary after provision of the release layer over the entire surface of the substrate 1301.

The insulating films 1302 and 1304 are each formed of an insulating material such as silicon oxide, silicon nitride, silicon oxynitride ($SiO_xN_y$) (x>y>0), or silicon nitride oxide ($SiN_xO_y$) (x>y>0), by a CVD method, a sputtering method, or the like. For example, in a case where the insulating films 1302 and 1304 each have a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. The insulating film 1302 functions as a blocking layer for preventing an impurity element in the substrate 1301 from being mixed into the release layer 1303 or an element formed thereover. The insulating film 1304 functions as a blocking layer for preventing an impurity element in the substrate 1301 and the release layer 1303 from being mixed into an element formed over the substrate 1301 and the release layer 1303. By forming the insulating films 1302 and 1304 each functioning as a blocking layer in this manner, it is possible to prevent alkaline metal or alkali earth metal such as Na in the substrate 1301 and an impurity element included in the release layer 1303 from adversely affecting an element to be formed over the substrate 1301 and the release layer 1303. In a case of using quartz for the substrate 1301, the insulating films 1302 and 1304 may be omitted.

As the release layer 1303, a metal film, a stacked layer structure of a metal film and a metal oxide film, or the like can be used. The metal film is formed as a single layer or stacked layers of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing any of the above elements as its main component. The metal film can be formed by a sputtering method, various CVD methods such as a plasma CVD method, or the like. As the stacked layer structure of a metal film and a metal oxide film, after the above-described metal film is formed, an oxide or oxynitride of the metal film can be formed on the metal film surface by performing plasma treatment in an oxygen atmosphere or an $N_2O$ atmosphere, or heat treatment in an oxygen atmosphere or an $N_2O$ atmosphere. For example, in a case where a tungsten film is formed by a sputtering method, a CVD method, or the like as the metal film, a metal oxide film of tungsten oxide can be formed on the tungsten film surface by performing plasma treatment on the tungsten film. In this case, an oxide of tungsten is expressed by $WO_x$, and x is 2 to 3. There are cases of x=2 ($WO_2$), x=2.5 ($W_2O_5$), x=2.75 ($W_4O_{11}$), x=3 ($WO_3$), and the like. When forming an oxide of tungsten, the value of x described above is not particularly restricted, and which oxide is to be formed may be determined based on an etching rate or the like. Alternatively, for example, a metal film (such as tungsten) is formed and then an insulating film of silicon oxide ($SiO_2$) or the like is formed over the metal film by a sputtering method, and a metal oxide may be formed over the metal film (for example, a tungsten oxide over tungsten). Further, as plasma treatment, the above-described high-density plasma treatment may be performed, for example. Instead of the metal oxide film, a metal nitride or a metal oxynitride may be used. In this case, the metal film may be subjected to the plasma treatment or the heat treatment in a nitrogen atmosphere or an atmosphere of nitrogen and oxygen.

The semiconductor film 1305 is formed to a thickness of 25 to 200 nm (preferably, 30 to 150 nm) by a sputtering method, an LPCVD method, a plasma CVD method, or the like.

Next, the semiconductor film 1305 is crystallized by being irradiated with a laser beam. Note that the semiconductor film 1305 may be crystallized by a method in which irradiation with a laser beam is combined with a thermal crystallization method using an RTA or an annealing furnace, or a thermal crystallization method using a metal element for promoting crystallization, or the like. After that, the obtained semiconductor film is etched so as to have a desired shape, so that crystalline semiconductor films 1305a to 1305f are formed. Then, a gate insulating film 1306 is formed so as to cover the crystalline semiconductor films 1305a to 1305f (see FIG. 13B).

The gate insulating film 1306 is formed of an insulating material such as silicon oxide, silicon nitride, silicon oxynitride ($SiO_xN_y$) ($x>y>0$), or silicon nitride oxide ($SiN_xO_y$) ($x>y>0$), by a CVD method, a sputtering method, or the like. For example, in a case where the gate insulating film 1306 has a two-layer structure, a silicon oxynitride film may be formed as a first insulating film and a silicon nitride oxide film may be formed as a second insulating film. Alternatively, a silicon oxide film may be formed as the first insulating film and a silicon nitride film may be formed as the second insulating film.

An example of a manufacturing step of the crystalline semiconductor films 1305a to 1305f is briefly described below. First, an amorphous semiconductor film with a thickness of 50 to 60 nm is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed on the amorphous semiconductor film, so that a crystalline semiconductor film is formed. After that, the crystalline semiconductor film is irradiated with a laser beam, and a photolithography method is used, so that the crystalline semiconductor films 1305a to 1305f are formed. Note that without being subjected to the thermal crystallization which uses the metal element for promoting crystallization, the amorphous semiconductor film may be crystallized only by irradiation with a laser beam.

As a laser oscillator used for crystallization, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser, or an excimer laser; a laser of which medium is single crystalline YAG; $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd:$YVO_4$ laser (fundamental wave of 1064 nm) can be used. In this case, a power density of approximately 0.01 to 100 $MW/cm^2$ (preferably, 0.1 to 10 $MW/cm^2$) is necessary. Irradiation is conducted at a scanning rate of approximately 10 to 2000 cm/sec. It is to be noted that, a laser using, as a medium, single crystalline YAG, $YVO_4$, forsterite ($Mg_2SiO_4$), $YAlO_3$, or $GdVO_4$, or polycrystalline (ceramic) YAG; $Y_2O_3$, $YVO_4$, $YAlO_3$, or $GdVO_4$ added with one or more of Nd, Yb, Cr, Ti, Ho, Er, Tm, and Ta as a dopant; an Ar ion laser; or a Ti:sapphire laser can be continuously oscillated. Furthermore, pulse oscillation thereof can be performed at a repetition rate of 10 MHz or higher by carrying out Q switch operation, mode locking, or the like. In a case where a laser beam is oscillated at a repetition rate of equal to or higher than 10 MHz, after a semiconductor film is melted by a laser and before it is solidified, the semiconductor film is irradiated with a next pulse. Therefore, unlike a case of using a pulsed laser with a low repetition rate, a solid-liquid interface can be continuously moved in the semiconductor film, so that crystal grains which continuously grow in a scanning direction can be obtained.

Alternatively, the gate insulating film 1306 may be formed by performing the above high-density plasma treatment on the crystalline semiconductor films 1305a to 1305f to oxidize or nitride the surfaces thereof. For example, the gate insulating film 1306 is formed by plasma treatment introducing a mixed gas of a rare gas such as He, Ar, Kr, or Xe and oxygen, nitrogen oxide ($NO_2$), ammonia, nitrogen, hydrogen, or the like. When excitation of the plasma in this case is performed by introduction of a microwave, plasma with a low electron temperature and high density can be generated. By an oxygen radical (there is a case where an OH radical is included) or a nitrogen radical (there is a case where an NH radical is included) generated by this high-density plasma, the surfaces of the semiconductor films can be oxidized or nitrided.

By treatment using such high-density plasma, an insulating film with a thickness of 1 to 20 nm, typically 5 to 10 nm, is formed over the semiconductor film. Since the reaction of this case is a solid-phase reaction, interface state density between the insulating film and the semiconductor film can be extremely low. Since such high-density plasma treatment oxidizes (or nitrides) a semiconductor film (crystalline silicon or polycrystalline silicon) directly, unevenness of a thickness of the insulating film to be formed can be extremely small, ideally. In addition, oxidation is not strengthened even in a crystal grain boundary of crystalline silicon, which makes a very preferable condition. That is, by a solid-phase oxidation of the surface of the semiconductor film by the high-density plasma treatment shown here, an insulating film with good uniformity and low interface state density can be formed without abnormal oxidation reaction in a crystal grain boundary.

As the gate insulating film 1306, an insulating film formed by the high-density plasma treatment may be used by itself, or an insulating film of silicon oxide, silicon oxynitride, silicon nitride, or the like may be formed thereover by a CVD method using plasma or thermal reaction, so as to make stacked layers. In any case, a transistor including an insulating film formed by high-density plasma, in a part of the gate insulating film or in the whole gate insulating film, can reduce variation in the characteristics.

Furthermore, a semiconductor film is irradiated with a continuous wave laser or a laser beam oscillated at a repetition rate of equal to or higher than 10 MHz and is scanned in one direction for crystallization, so that each of the crystalline semiconductor films 1305a to 1305f which has a characteristic that the crystal grows in the scanning direction of the beam is obtained. When a transistor is provided so that the scanning direction is aligned with the channel length direction (a direction in which carriers flow when a channel formation region is formed) and the above-descriebed gate insulating layer is used, a thin film transistor (TFT) with less characteristic variation and high field effect mobility can be obtained.

Next, a first conductive film and a second conductive film are stacked over the gate insulating film 1306. Here, the first conductive film is formed to a thickness of 20 to 100 nm by a CVD method, a sputtering method, or the like, and the second conductive film is formed to a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above-described elements as its main component. Alternatively, they are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in a case of a three-layer structure instead of a two-layer structure, a stacked layer structure of a molybdenum film, an aluminum film, and a molybdenum film is preferably employed.

Next, a resist mask is formed by a photolithography method, and etching treatment for forming a gate electrode and a gate line is performed, so that gate electrodes 1307 are formed above the semiconductor films 1305a to 1305f. Here, an example in which the gate electrode 1307 has a stacked layer structure of a first conductive film 1307a and a second conductive film 1307b is shown.

Next, with the use of the gate electrode 1307 as a mask, an impurity element imparting n-type conductivity is added to the crystalline semiconductor films 1305a to 1305f at low concentration by an ion doping method or an ion implantation method, and then, a resist mask is selectively formed by a photolithography method and an impurity element imparting p-type conductivity is added at high concentration. As an impurity element imparting n-type conductivity, phosphorus (P), arsenic (As), or the like can be used. As an impurity element imparting p-type conductivity, boron (B), aluminum (Al), gallium (Ga), or the like can be used. Here, phosphorus (P) is used for the impurity element imparting n-type conductivity, and is selectively introduced into the crystalline semiconductor films 1305a to 1305f at a concentration of $1 \times 10^{15}$ to $1 \times 10^{19}/cm^3$, so that an n-type impurity region 1308 is formed. Further, boron (B) is used for the impurity element imparting p-type conductivity, and is selectively introduced into the crystalline semiconductor films 1305c and 1305e at a concentration of $1 \times 10^{19}$ to $1 \times 10^{20}/cm^3$, so that a p-type impurity region 1309 is formed (see FIG. 13C).

Next, an insulating film is formed so as to cover the gate insulating film 1306 and the gate electrodes 1307. The insulating film is formed as a single layer or stacked layers of a film including an inorganic material such as silicon, an oxide of silicon, or a nitride of silicon, or an organic material such as an organic resin, by a plasma CVD method, a sputtering method, or the like. Next, the insulating film is selectively etched by anisotropic etching which mainly etches in a perpendicular direction, so that insulating films 1310 (also referred to as side walls) which are in contact with side surfaces of the gate electrodes 1307 are formed. The insulating films 1310 are used as masks for doping when LDD (lightly doped drain) regions are formed.

Next, with the use of a resist mask formed by a photolithography method, the gate electrodes 1307, and the insulating films 1310 as masks, an impurity element imparting n-type conductivity is added to the crystalline semiconductor films 1305a, 1305b, 1305d, and 1305f at high concentration, so that n-type impurity regions 1311 are formed. Here, phosphorus (P) is used for the impurity element imparting n-type conductivity, and is selectively introduced into the crystalline semiconductor films 1305a, 1305b, 1305d, and 1305f at a concentration of $1 \times 10^{19}$ to $1 \times 10^{20}/cm^3$, so that the n-type impurity regions 1311 with higher concentration than the n-type impurity regions 1308 are formed.

Through aforementioned steps, n-channel thin film transistors 1300a, 1300b, 1300d, and 1300f, and p-channel thin film transistors 1300c and 1300e are formed.

In the n-channel thin film transistor 1300a, a channel formation region is formed in a region of a semiconductor film 1305a, which overlaps with the gate electrode 1307; the impurity region 1311 forming a source region or a drain region is formed in a region which does not overlap with the gate electrode 1307 and the insulating film 1310; and a lightly doped drain region (LDD region) is formed in a region which overlaps with the insulating film 1310 and is between the channel formation region and the impurity region 1311. Similarly, in the n-channel thin film transistors 1300b, 1300d, and 1300f, a channel formation region, a lightly doped drain region, and the impurity region 1311 are formed.

In the p-channel thin film transistor 1300c, a channel formation region is formed in a region of a semiconductor film 1305c, which overlaps with the gate electrode 1307, and the impurity region 1309 forming a source region or a drain region is formed in a region which does not overlap with the gate electrode 1307. Similarly, in the p-channel thin film transistor 1300e, a channel formation region and an impurity region 1309 are formed. Note that although each of the p-channel thin film transistors 1300c and 1300e is not provided with an LDD region here, a structure may be employed, in which each of the p-channel thin film transistors is provided with an LDD region or each of the n-channel thin film transistors is not provided with an LDD region.

Next, an insulating film is formed as a single layer or stacked layers so as to cover the semiconductor films 1305a to 1305f, the gate electrodes 1307, and the like, so that conductive films 1313 are formed over the insulating film, which are electrically connected to the impurity regions 1309 and 1311 for forming source and drain regions of the thin film transistors 1300a to 1300f (see FIG. 14A). The insulating film is formed as a single layer or stacked layers using an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharging method, a screen printing method, or the like. Here, the insulating film is formed to have a two-layer structure. A silicon nitride oxide film is formed as a first insulating film 1312a, and a silicon oxynitride film is formed as a second insulating film 1312b. The conductive films 1313 form source and drain electrodes of the thin film transistors 1300a to 1300f.

It is to be noted that before the insulating films 1312a and 1312b are formed or after one or more of thin films of the insulating films 1312a and 1312b are formed, heat treatment for recovering the crystallinity of the semiconductor film, for activating the impurity element which has been added to the semiconductor film, or for hydrogenating the semiconductor film is preferably performed. For the heat treatment, thermal annealing, a laser annealing method, an RTA method, or the like is preferably employed.

The conductive film 1313 is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above-described elements as its main component. An alloy material containing aluminum as its main component corresponds to a material which contains aluminum as its main component and also contains nickel, or an alloy material which contains aluminum as its main component and also contains nickel and one or both of carbon and silicon, for example. The conductive film 1313 may employ, for example, a stacked layer structure of a barrier film, an aluminum-silicon (Al—Si) film, and a barrier film, or a stacked layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 1313. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film can be reduced so that preferable contact with the crystalline semiconductor film can be obtained.

Next, an insulating film 1314 is formed so as to cover the conductive films 1313, and conductive films 1315a and 1315b are formed over the insulating film 1314 to be electrically connected to the conductive films 1313 each of which forms a source electrode or a drain electrode of the thin film transistor 1300a or 1300f. Then, conductive films 1316 are formed to be electrically connected to the conductive films 1313 each of which forms a source electrode or a drain electrode of the thin film transistor 1300b or 1300e. Note that the conductive films 1315a and 1315b and the conductive film 1316 may be concurrently formed using the same material. The conductive films 1315a and 1315b and the conductive films 1316 can be formed using any of the materials given for the conductive films 1313.

After that, a conductive film 1317 functioning as an antenna is formed so as to be electrically connected to the conductive film 1316 (see FIG. 14B).

The insulating film 1314 can be formed by a CVD method, a sputtering method, or the like to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film; a film containing carbon such as DLC (diamond like carbon); an organic material such as epoxy, polyimide, polyamide, polyvinylphenol, benzocyclobutene, or acrylic; or a siloxane material such as a siloxane resin. Note that the siloxane material is a material including a Si—O—Si bond. Siloxane is composed of a skeleton formed by the bond of silicon (Si) and oxygen (O), in which an organic group containing at least hydrogen (such as an alkyl group or aromatic hydrocarbon) is contained as a substituent. Alternatively, a fluoro group may be used as the substituent. Further alternatively, a fluoro group and an organic group containing at least hydrogen may be used as the substituent.

The conductive film 1317 is formed using a conductive material by a CVD method, a sputtering method, a printing method such as screen printing or gravure printing, a droplet discharging method, a dispensing method, a plating method, or the like. The conductive material is formed to have a single-layer structure or a stacked-layer structure with the use of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing any of the above-described elements as its main component.

For example, in a case of forming the conductive films 1317 functioning as an antenna by a screen printing method, the conductive films can be formed by being selectively printed with conductive paste in which conductive particles each having a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) or silver halide can be used. As the organic resin contained in the conductive paste, one or a plurality of organic resins each functioning as a binder, a solvent, a dispersant, or a coating of the metal particle can be used. Typically, an organic resin such as an epoxy resin or a silicon resin can be used. When forming a conductive film, baking is preferably performed after the conductive paste is applied. For example, in a case of using fine particles (of which grain size is 1 to 100 nm) containing silver as its main component as a material of the conductive paste, the conductive paste is hardened by being baked at a temperature of 150 to 300° C., so that a conductive film can be obtained. Alternatively, fine particles containing solder or lead-free solder as its main component may be used; in this case, it is preferable to use a fine particle having a grain size of equal to or smaller than 20 μm. Solder and lead-free solder have an advantage such as low cost.

The conductive films 1315a and 1315b can function as wirings electrically connected to a secondary battery included in the semiconductor device of the present invention in a subsequent step. When forming the conductive film 1317 which functions as an antenna, another conductive film may be formed so as to be electrically conneceted to the conductive films 1315a and 1315b and the conductive film may be used as a wiring connected to the secondary battery.

Next, after an insulating film 1318 is formed so as to cover the conductive film 1317, a layer including the thin film transistors 1300a to 1300f, the conductive films 1317, and the like (hereinafter referred to as an "element formation layer 1319") is released from the substrate 1301. Here, openings are formed by a laser beam (such as UV light) irradiation in a region except portions in which the thin film transistors 1300a to 1300f are formed (see FIG. 14C), and then, the element formation layer 1319 can be released from the substrate 1301 by using a physical force. Alternatively, an etchant may be introduced into the openings before the element formation layer 1319 is released from the substrate 1301 in order to selectively remove the release layer 1303. As the etchant, gas or a liquid containing halogen fluoride or an interhalogen compound is used. For example, chlorine trifluoride ($ClF_3$) is used as gas containing halogen fluoride. Thus, the element formation layer 1319 is released from the substrate 1301. Note that the release layer 1303 may be partially left instead of being removed entirely. This makes it possible to reduce consumption of the etchant and shorten process time for removing the release layer. In addition, the element formation layer 1319 can be retained over the substrate 1301 even after the release layer 1303 is removed. In addition, the substrate 1301 is reused after the element formation layer 1319 is released, whereby the cost can be reduced.

The insulating film 1318 can be formed by a CVD method, a sputtering method, or the like to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film; a film containing carbon such as DLC (diamond like carbon); or an organic material such as epoxy, polyimide, polyamide, polyvinylphenol, benzocyclobutene, or acrylic; or a siloxane material such as a siloxane resin.

Figure 15A:
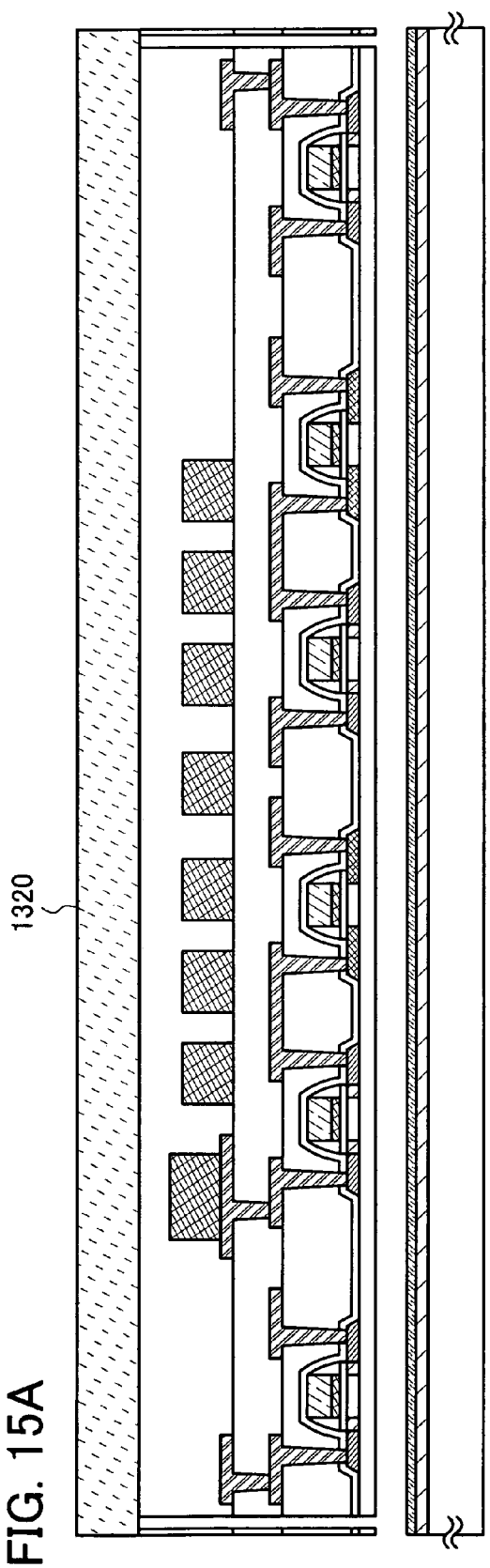
FIGS. 15A and 15B are views showing an example of a method for manufacturing a semiconductor device of the present invention.

In this embodiment, after an opening is formed in the element formation layer 1319 by laser beam irradiation, a first sheet material 1319 is attached to one surface of the element formation layer 1319 (a surface of the insulating film 1318 that is exposed). Then, the element formation layer 1319 is released from the substrate 1301 (see FIG. 15A).

Figure 15B:
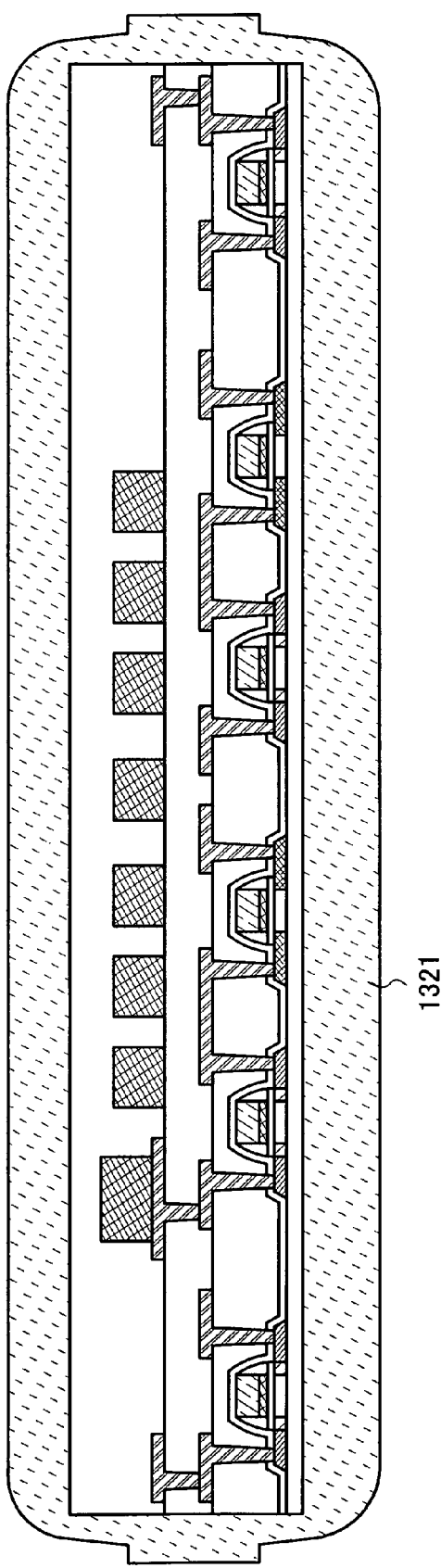

Next, a second sheet material 1321 is attached to the other surface of the element formation layer 1319 (a surface exposed by releasing) by one or both of heat treatment and pressure treatment (see FIG. 15B). As the first sheet material 1320 and the second sheet material 1321, a hot-melt film or the like can be used.

As the first sheet material 1320 and the second sheet material 1321, a film to which antistatic treatment for preventing static electricity or the like is performed (hereinafter referred to as an antistatic film) may be used. As the antistatic film, a film with an antistatic material dispersed in a resin, a film with an antistatic material attached thereto, and the like can be given as examples. The film provided with an antistatic material may be a film with an antistatic material provided over one of its surfaces, or a film with an antistatic material provided over each of its surfaces. As for the film with an antistatic material provided over one of its surfaces, the film may be attached to the layer so that the antistatic material is placed on the inner side of the film or the outer side of the film. Note that the antistatic material may be provided over an entire surface of the film, or over a part of the film. As the antistatic material here, a metal, indium tin oxide (ITO), or a surfactant such as an amphoteric surfactant, a cationic surfactant, or a nonionic surfactant can be used. Alternatively, as the antistatic material, a resin material containing cross-linked copolymer having a carboxyl group and a quaternary ammonium base on its side chain, or the like can be used. By attaching, mixing, or applying such a material to a film, an antistatic film can be formed. The sealing is performed using the antistatic film, and thus a semiconductor element can be prevented from being adversely affected due to static electricity from external when dealt with as a product.

A thin film secondary battery is connected to the conductive films 1315a and 1315b so that a storage capacitor of a power supply circuit is formed. The secondary battery may be connected to the conductive films 1315a and 1315b before or after the element formation layer 1319 is released from the substrate 1301 (a step in FIG. 14B or 14C, or a step in FIG. 15A), or after the element formation layer 1319 is sealed with the first sheet material and the second sheet material (a step in FIG. 15B). Hereinafter, an example in which the element formation layer 1319 and the secondary battery are connected to each other is described with reference to FIGS. 16A to 17B.

In FIG. 14B, conductive films 1331a and 1331b electrically connected to the conductive films 1315a and 1315b respectively are formed at the same time as the conductive film 1317 functioning as an antenna. After the insulating film 1318 is formed so as to cover the conductive films 1317, 1331a and 1331b, openings 1332a and 1332b are formed so that surfaces of the conductive films 1331a and 1331b are exposed. Then, after an opening is formed in the element formation layer 1319 by irradiation with a laser beam, a first sheet material 1320 is attached to one surface of the element formation layer 1319 (the surface of the insulating film 1318 that is exposed). Then, the element formation layer 1313 is released from the substrate 1301 (see FIG. 16A).

Next, the second sheet material 1321 is attached to the other surface of the element formation layer 1319 (the surface exposed by peeling), and then, the element formation layer 1319 is released from the first sheet material 1320. Therefore, the first sheet material 1320 that has low adhesion is used here. After that, conductive films 1334a and 1334b which are electrically connected to the conductive films 1331a and 1331b are selectively formed through the openings 1332a and 1332b, respectively (see FIG. 16B).

The conductive films 1334a and 1334b functioning as antennas are formed using a conductive material by a CVD method, a sputtering method, a printing method such as screen printing or gravure printing, a droplet discharging method, a dispensing method, a plating method, or the like. The conductive material is formed as a single layer or stacked layers using an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing any of the above-described elements as its main component.

Note that an example is described here, in which after the element formation layer 1319 is released from the substrate 1301, the conductive films 1334a and 1334b are formed. Alternatively, the element formation layer 1319 may be released from the substrate 1301 after formation of the conductive films 1334a and 1334b.

Next, when a plurality of elements are formed over the substrate, each element of the element formation layer 1319 is separated (see FIG. 17A). A laser irradiation apparatus, a dicing apparatus, a scribing apparatus, or the like can be used for separation. Here, each of the plurality of elements formed over one substrate is separated by irradiation with a laser beam.

Next, the separated element is electrically connected to the secondary battery (see FIG. 17B). In this embodiment, the thin film secondary battery is used as the storage capacitor of the power supply circuit. As the thin film secondary battery, thin film layers: a collector thin film, a negative active material layer, a solid electrolyte layer, a positive active material layer, and a collector thin film, are stacked in that order.

The conductive films 1336a and 1336b are formed using a conductive material by a CVD method, a sputtering method, a printing method such as screen printing or gravure printing, a droplet discharging method, a dispensing method, a plating method, or the like. The conductive material is formed as a single layer or stacked layers using an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing any of the above-described elements as its main component. It is necessary for the conductive material to have high adhesion to a negative active material and low resistance. Aluminum, copper, nickel, vanadium, and the like are particularly preferable.

Next, the structure of a thin film secondary battery is described in detail. A negative active material layer 1381 is formed over the conductive film 1336a. Vanadium oxide ($V_2O_5$) or the like is generally used for the negative active material layer 1381. Then, a solid electrolyte layer 1382 is formed over the negative active material layer 1381. Lithium phosphate ($Li_3PO_4$) or the like is generally used for the solid electrolyte layer 1382. Then, a positive active material layer 1383 is formed over the solid electrolyte layer 1382. Lithium manganese ($LiMn_2O_4$) or the like is generally used for the positive active material layer 1383. Alternatively, lithium cobalt oxide ($LiCoO_2$) or lithium nickel oxide ($LiNiO_2$) may be used. Then, a collector thin film 1384 which serves as an electrode is formed over the positive active material layer 1383. It is necessary for the collector thin film 1384 to have high adhesion to a negative active material and low resistance, and thus, aluminum, copper, nickel, vanadium, or the like can be used as the collector thin film 1384.

Each of the thin film layers, that is, the negative active material layer 1381, the solid electrolyte layer 1382, the positive active material layer 1383, and the collector thin film 1384, may be formed using a sputtering technique or an evaporation technique. The thickness of each layer is preferably 0.1 to 3 μm.

Next, a resin is applied to form an interlayer film 1385. Then, the interlayer film 1385 is etched to form a contact hole. The interlayer film 1385 is not limited to being formed of a resin. Another type of film, such as a CVD oxide film, may also be used; however, a resin is preferable in terms of planarity. Alternatively, the contact hole may be formed using a photosensitive resin without etching. After that, a wiring layer 1386 is formed over the interlayer film 1385 and connected to the conductive film 1334b and thus electrical connection of the thin film secondary battery is secured.

Here, the conductive films 1334a and 1334b which are provided over the element formation layer 1319 are connected in advance to conductive films 1336a and 1336b which serve as connecting terminals of the thin film secondary battery 1389, respectively. Here, a case is described in which the conductive films 1334a and 1336a or the conductive films 1334b and 1336b are electrically connected to each other by being pressure-bonded with an adhesive material such as an anisotropic conductive film (ACF) or an anisotropic conductive paste (ACP) therebetween. Here, an example in which the connection is made using a conductive particle 1338 included in an adhesive resin 1337 is shown. Alternatively, a conductive adhesive such as a silver paste, a copper paste, or a carbon paste; solder joint; or the like may be used for the connection.

A transistor can have various structures without limitation to a certain structure described in this embodiment. For example, a multi-gate structure having two or more gate electrodes may be used. With a multi-gate structure, channel regions are connected in series; therefore, a plurality of transistors are connected in series. With a multi-gate structure, an off current can be reduced, and the withstand voltage of the transistor can be increased, which improves reliability. In addition, even if a drain-source voltage fluctuates when the transistor operates in a saturation region, drain-source current does not fluctuate very much, and stable characteristics can be provided. In addition, a structure in which gate electrodes are formed above and below a channel may be used. With the use of the structure in which gate electrodes are formed above and below the channel, a channel region is enlarged so that the amount of current flowing therethrough is increased, or a depletion layer can be easily formed, so that the subthreshold swing can be decreased. Further, when the gate electrodes are provided above and below the channel, a plurality of transistors are connected in parallel.

Further, a gate electrode may be provided above or below the channel. Either a staggered structure or an inversely staggered structure may be employed. A channel region may be divided into a plurality of regions, or connected in parallel or in series. When a source electrode or a drain electrode does not overlap with a channel (or a part of it), unstable operation due to accumulation of charges in a part of the channel can be prevented. Further, an LDD region may be provided. By providing an LDD region, an off current can be reduced and reliability can be improved by improving the withstand voltage of a transistor, and more stable characteristics can be obtained since a drain-source current does not change so much even when a drain-source voltage changes in operation in a saturation region.

Note that the method for manufacturing the semiconductor device of this embodiment can be applied to the semiconductor device of any of the other embodiments in this specification. That is, regarding the semiconductor device of this embodiment, the transmitting and receiving circuit can be formed of fewer transistors without impairing the function of the transmitting and receiving circuit. Therefore, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

Embodiment 4

In this embodiment, an example of a method for manufacturing the semiconductor device described in Embodiment 2 is described with reference to the drawings. In this embodiment, a structure in which an antenna, a battery, and a semiconductor integrated circuit in the semiconductor device are formed over one substrate is described. Note that the antenna, the battery, and the semiconductor integrated circuit are formed over one substrate by using a transistor of which a channel formation region is formed over a single crystal substrate. With a transistor formed over a single crystal substrate, a semiconductor device can be formed of the transistor with less variation in transistor characteristics, which is preferable. An example where a thin film secondary battery is used as a battery is described.

Figure 18A:
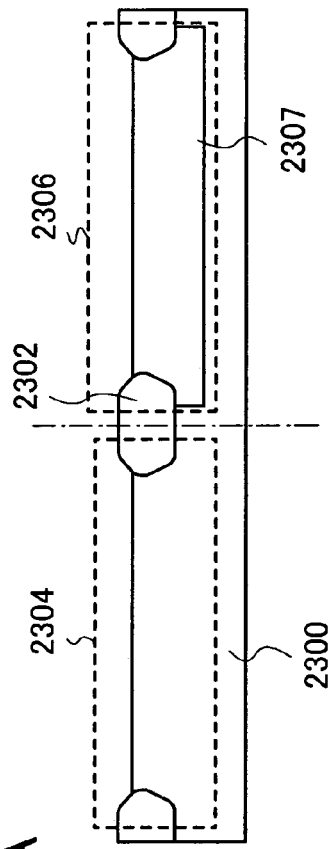
FIGS. 18A to 18C are views showing an example of a method for manufacturing a semiconductor device of the present invention.

First, separated element regions 2304 and 2306 (hereinafter also referred to as regions 2304 and 2306) are formed in a semiconductor substrate 2300 (see FIG. 18A). The regions 2304 and 2306 provided in the semiconductor substrate 2300 are separated from each other by an insulating film 2302 (also referred to as a field oxide film). Note that here, an example is described in which an n-type single crystalline silicon substrate is used as the semiconductor substrate 2300, and a p-well 2307 is provided in the region 2306 in the semiconductor substrate 2300.

Any semiconductor substrate can be used as the semiconductor substrate 2300. For example, an n-type or p-type single crystalline silicon substrate, a compound semiconductor substrate (for example, a GaAs substrate, an InP substrate, a GaN substrate, a SiC substrate, a sapphire substrate, or a ZnSe substrate), an SOI (silicon on insulator) substrate manufactured by a bonding method or a SIMOX (separation by implanted oxygen) method, or the like can be used.

For the separated element regions 2304 and 2306, a selective oxidation method (LOCOS (local oxidation of silicon) method), a trench isolation method, or the like can be used as appropriate.

Furthermore, the p-well in the region 2306 of the semiconductor substrate 2300 can be formed by selective introduction of an impurity element imparting p-type conductivity into the semiconductor substrate 2300. As the impurity element imparting p-type conductivity, boron (B), aluminum (Al), gallium (Ga), or the like can be used.

Note that although an impurity element is not introduced into the region 2304 because the n-type semiconductor substrate is used as the semiconductor substrate 2300 in this embodiment, an n-well may be formed in the region 2304 by introduction of an impurity element imparting n-type conductivity. As the impurity element imparting n-type conductivity, phosphorus (P), arsenic (As), or the like can be used. On the other hand, in the case where a p-type semiconductor substrate is used, an n-well may be formed in the region 2304 by introduction of an impurity element imparting n-type conductivity and no impurity element may be introduced into the region 2306.

Figure 18B:
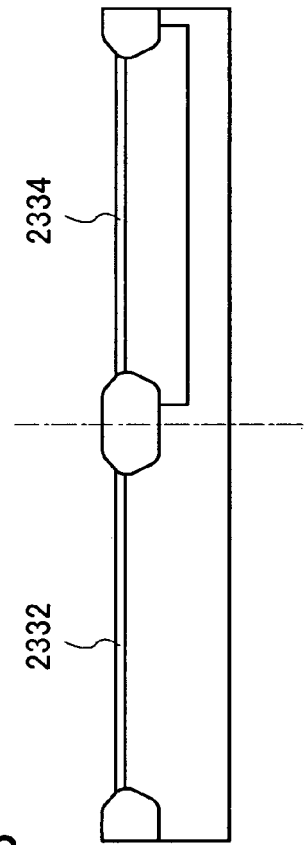

Next, the insulating films 2332 and 2334 are formed so as to cover the regions 2304 and 2306, respectively (see FIG. 18B)

The insulating films 2332 and 2334 can be formed of silicon oxide films by oxidizing surfaces of the regions 2304 and 2306 in the semiconductor substrate 2300 respectively by heat treatment. Alternatively, the insulating films 2332 and 2334 can be formed to have a stacked-layer structure of a silicon oxide film and a silicon film containing oxygen and nitrogen (silicon oxynitride film) by forming the silicon oxide film using a thermal oxidation method and then nitriding the surface of the silicon oxide film by nitridation treatment.

Further alternatively, the insulating films 2332 and 2334 may be formed using plasma treatment. For example, by performing oxidation treatment or nitridation treatment with high-density plasma treatment on the surfaces of the regions 2304 and 2306 in the semiconductor substrate 2300, silicon oxide ($SiO_x$) films or silicon nitride ($SiN_x$) films can be formed as the insulating films 2332 and 2334. Further, after oxidation treatment is performed on the surfaces of the regions 2304 and 2306 with high-density plasma treatment, nitridation treatment may be performed by performing high-density plasma treatment again. In this case, silicon oxide films are formed on surfaces of the regions 2304 and 2306, and silicon oxynitride films are formed over the silicon oxide films, so that each of the insulating films 2332 and 2334 has a stacked-layer structure of the silicon oxide film and the silicon oxynitride film. Further alternatively, after silicon oxide films are formed on the surfaces of the regions 2304 and 2306 by a thermal oxidation method, oxidation treatment or nitridation treatment may be performed with high-density plasma treatment.

Note that the insulating films 2332 and 2334 which are formed in the regions 2304 and 2306 in the semiconductor substrate 2300 function as gate insulating films in a transistor to be completed later.

Figure 18C:
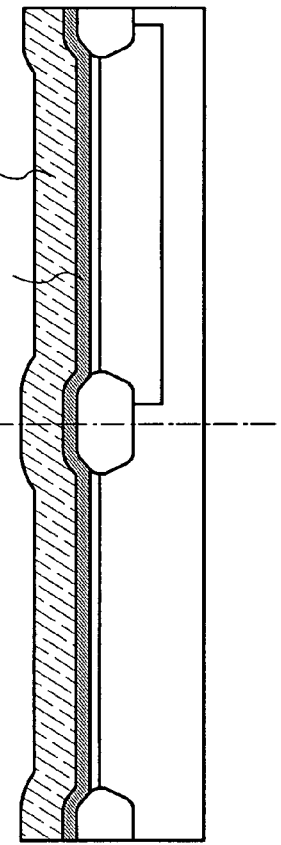

Next, a conductive film is formed so as to cover the insulating films 2332 and 2334 formed over the regions 2304 and 2306 (see FIG. 18C). Here, a conductive film 2336 and a conductive film 2338 are stacked in that order as the conductive film. It is needless to say that the conductive film may be formed to have a single-layer structure or a staked-layer structure including three or more layers.

The conductive films 2336 and 2338 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above-described elements as its main component. Alternatively, a metal nitride film obtained by nitridation of any of the above-described elements can be used. Further alternatively, a semiconductor material typified by polycrystalline silicon doped with an impurity element such as phosphorus can be used.

Here, the conductive film is formed to have a stacked-layer structure by forming the conductive film 2336 using tantalum nitride and forming the conductive film 2338 using tungsten thereover. Alternatively, a single-layer or stacked-layer film of a tungsten nitride, a molybdenum nitride, and a titanium nitride can be used as the conductive film 2336, and a single-layer or stacked-layer film of tantalum, molybdenum, and titanium can be used as the conductive film 2338.

Figure 19A:
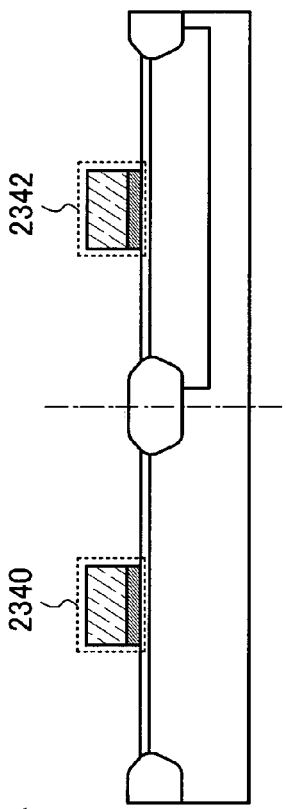
FIGS. 19A to 19C are views showing an example of a method for manufacturing a semiconductor device of the present invention.

Next, by selectively etching and removing the conductive films 2336 and 2338 which are stacked, the conductive films 2336 and 2338 are partially left over the regions 2304 and 2306 to form gate electrodes 2340 and 2342 (see FIG. 19A).

Figure 19B:
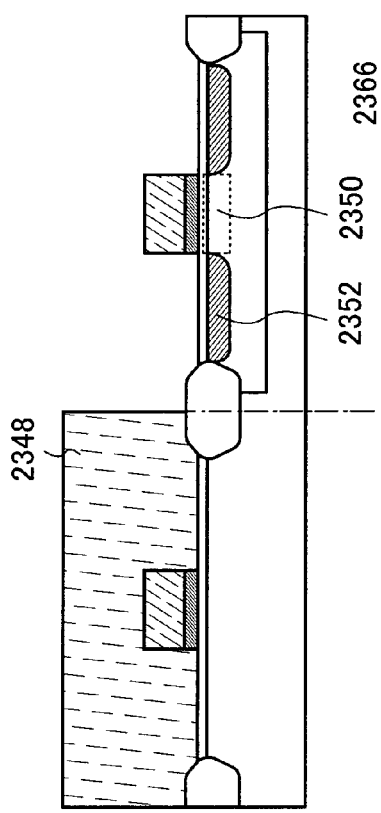

Next, a resist mask 2348 is selectively formed so as to cover the region 2304 and an impurity element is introduced into the region 2306 by using the resist mask 2348 and the gate electrode 2342 as masks, so that impurity regions are formed (see FIG. 19B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is used as the impurity element.

In FIG. 19B, by introducing the impurity element, impurity regions 2352 forming source and drain regions and a channel formation region 2350 are formed in the region 2303.

Figure 19C:
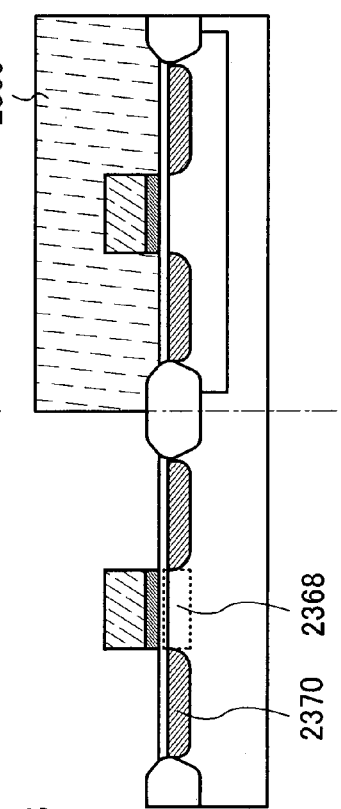

Next, a resist mask 2366 is selectively formed so as to cover the region 2306, and an impurity element is introduced into the region 2304 with the use of the resist mask 2366 and the gate electrode 2340 as masks, so that an impurity region is formed (FIG. 19C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, an impurity element having a conductivity type which is different from that of the impurity element introduced into the region 2306 in FIG. 19C (for example, boron (B)) is introduced. As a result, impurity regions 2370 forming source and drain regions and a channel formation region 2368 are formed in the region 2304.

Next, a second insulating film 2372 is formed so as to cover the insulating films 2332 and 2334 and the gate electrodes 2340 and 2342; and over the second insulating film 2372, a wiring 2374 is formed to be electrically connected to the impurity regions 2352 and 2370 formed in the regions 2304 and 2306, respectively (see FIG. 20A).

The second insulating film 2372 can be formed by a CVD method, a sputtering method, or the like to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film; a film containing carbon such as DLC (diamond like carbon); an organic material such as epoxy, polyimide, polyamide, polyvinylphenol, benzocyclobutene, or acrylic; or a siloxane material such as a siloxane resin. Note that the siloxane material is a material including a Si—O—Si bond. Siloxane is composed of a skeleton formed by the bond of silicon (Si) and oxygen (O), in which an organic group containing at least hydrogen (such as an alkyl group or aromatic hydrocarbon) is contained as a substituent. Alternatively, a fluoro group may be used as the substituent. Further alternatively, a fluoro group and an organic group containing at least hydrogen may be used as the substituent.

The wiring 2374 is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above-described elements as its main component. An alloy material containing aluminum as its main component corresponds to a material which contains aluminum as its main component and also contains nickel, or an alloy material which contains aluminum as its main component and also contains nickel and one or both of carbon and silicon, for example. The wiring 2374 preferably employs, for example, a stacked layer structure of a barrier film, an aluminum-silicon (Al—Si) film, and a barrier film, or a stacked-layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the wiring 2374. In addition, generation of a hillock of aluminum or aluminum silicon can be prevented when upper and lower barrier layers are formed. Furthermore, when the barrier film is formed by using titanium that is a highly-reducible element, even if a thin natural oxide film is formed over the crystalline semiconductor film, the natural oxide film can be reduced so that preferable contact with the crystalline semiconductor film can be obtained.

Note that the structure of the transistor included in the semiconductor device of the present invention is not limited to the structure shown in the drawings. For example, an inversely staggered structure, a FinFET structure, or the like may be employed. When a FinFET structure is used, a short-channel effect associated with miniaturization of the size of a transistor can be suppressed, which is preferable.

The semiconductor device of this embodiment includes a battery capable of supplying power to the semiconductor integrated circuit. As the battery, a thin film secondary battery or a capacitor such as an electric double layer capacitor is preferably used. In this embodiment, the connection of the transistor formed in this embodiment and a thin film secondary battery is described.

In this embodiment, the secondary battery is formed by being stacked over a wiring 2374 which is connected to the transistor. Thin film layers: a collector thin film, a negative active material layer, a solid electrolyte layer, a positive active material layer, and a collector thin film, are stacked in that order to form the thin film secondary battery (FIG. 20B). Therefore, it is necessary for a material of the wiring 2374 which is also used for the collector thin film of the secondary battery to have high adhesion to a negative active material and low resistance. Aluminum, copper, nickel, vanadium, and the like are particularly preferable.

Next, the structure of the thin film secondary battery is described in detail. A negative active material layer 2391 is formed over the wiring 2374. Vanadium oxide ($V_2O_5$) or the like is generally used for the negative active material layer 2391. Then, a solid electrolyte layer 2392 is formed over the negative active material layer 2391. Lithium phosphate ($Li_3PO_4$) or the like is generally used for the solid electrolyte layer 2392. Then, a positive active material layer 2393 is formed over the solid electrolyte layer 2392. Lithium manganese ($LiMn_2O_4$) or the like is generally used for the positive active material layer 2393. Alternatively, lithium cobalt oxide ($LiCoO_2$) or lithium nickel oxide ($LiNiO_2$) may be used. Then, a collector thin film 2394 which serves as an electrode is formed over the positive active material layer 2393. It is necessary for the collector thin film 2394 to have high adhesion to the positive active material layer 2393 and low resistance, and thus, aluminum, copper, nickel, vanadium, or the like can be used as the collector thin film 2394.

Each of the thin film layers, that is, the negative active material layer 2391, the solid electrolyte layer 2392, the positive active material layer 2393, and the collector thin film 2394, may be formed using a sputtering technique or an evaporation technique. The thickness of each layer is preferably 0.1 to 3 μm.

Next, a resin is applied to form an interlayer film 2396. Then, the interlayer film 2396 is etched to form a contact hole. The interlayer film 2396 is not limited to being formed of a resin. Another type of film, such as a CVD oxide film, may also be used; however, a resin is preferable in terms of planarity. Alternatively, the contact hole may be formed using a photosensitive resin without etching. After that, a wiring layer 2395 is formed over the interlayer film 2396 and connected to the wiring 2397 and thus electrical connection of the secondary battery is secured.

By employing the structure described above, the semiconductor device of the present invention can have a structure in which a transistor is formed over a single crystal substrate and a thin film secondary battery is provided thereover. Therefore, the semiconductor device of the present invention can be greatly reduced in thickness and size and have flexibility.

Note that the method for manufacturing the semiconductor device of this embodiment can be applied to the semiconductor device of any of the other embodiments in this specification. That is, regarding the semiconductor device of this embodiment, the transmitting and receiving circuit can be formed of fewer transistors without impairing the function of the transmitting and receiving circuit, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

Embodiment 5

In this embodiment mode, an example of a method for manufacturing a semiconductor device different from that in Embodiment 2 is described with reference to the drawings.

Figure 13A:
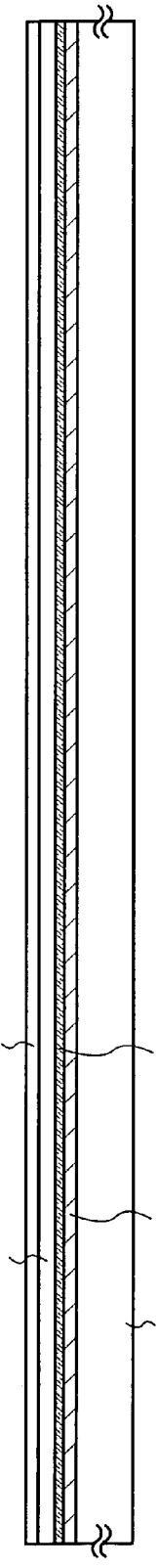
FIGS. 13A to 13D are views showing an example of a method for manufacturing a semiconductor device of the present invention.
Figure 13B:
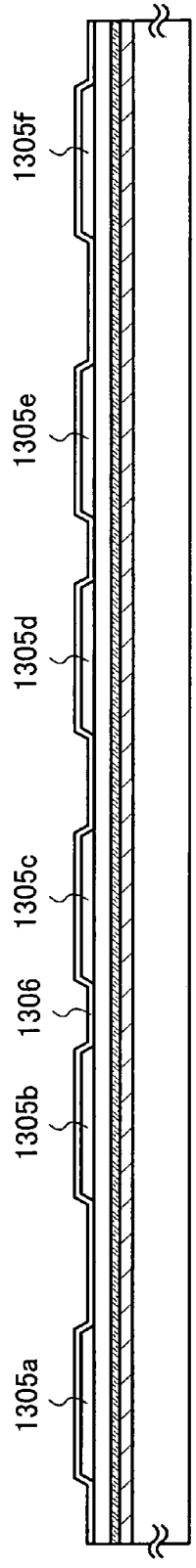
Figure 13C:
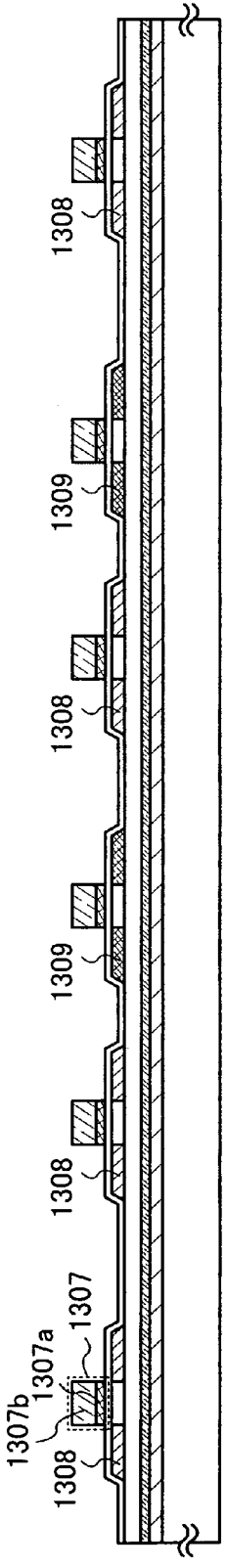
Figure 13D:
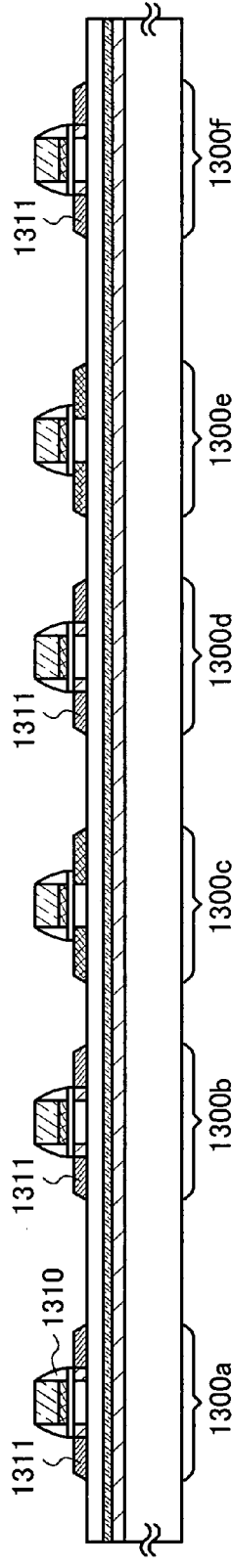
Figure 21A:
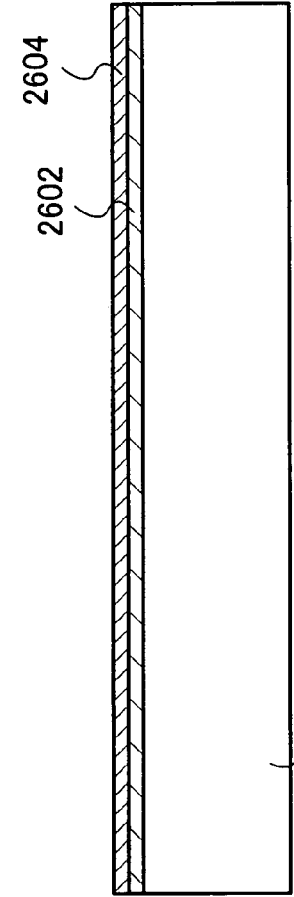
FIGS. 21A to 21C are views showing an example of a method for manufacturing a semiconductor device of the present invention.

First, an insulating film is formed over a substrate 2600 as shown in FIG. 13A. Here, n-type single crystalline silicon is used for the substrate 2600, and an insulating film 2602 and an insulating film 2604 are formed over the substrate 2600 (see FIG. 21A). For example, silicon oxide ($SiO_x$) is formed for the insulating film 2602 by performing heat treatment on the substrate 2600, and silicon nitride ($SiN_x$) is formed over the insulating film 2602 by a CVD method.

Any semiconductor substrate can be used as the substrate 2600. For example, an n-type or p-type single crystalline silicon substrate, a compound semiconductor substrate (for example, a GaAs substrate, an InP substrate, a GaN substrate, an SiC substrate, a sapphire substrate, or a ZnSe substrate), an SOI (silicon on insulator) substrate manufactured by a bonding method or a SIMOX (separation by implanted oxygen) method, or the like can be used.

Further, the insulating film 2604 may be provided by nitridation of the insulating film 2602 by high-density plasma treatment after formation of the insulating film 2602. Note that the insulating film to be provided over the substrate 2600 may be formed to have a single-layer structure or a staked-layer structure including three or more layers.

Figure 21B:
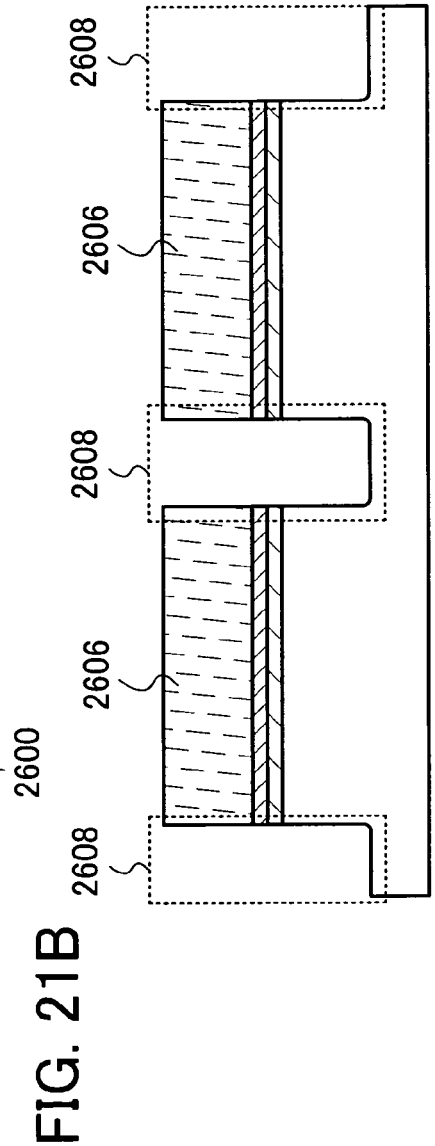

Next, patterns of resist masks 2606 are selectively formed over the insulating film 2604, and etching is selectively performed using the resist masks 2606 as masks, so that depressions 2608 are selectively formed in the substrate 2600 (see FIG. 21B). Etching of the substrate 2600 and the insulating films 2602 and 2604 can be performed by dry etching utilizing plasma.

Figure 21C:
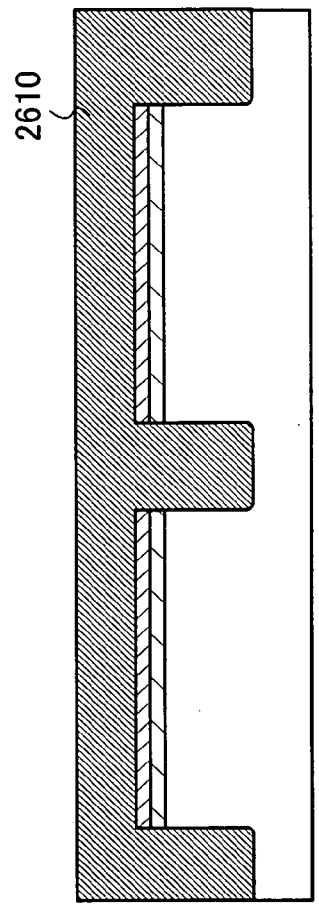

Next, after the patterns of the resist masks 2606 are removed, an insulating film 2610 is formed so as to fill the depressions 2608 formed in the substrate 2600 (see FIG. 21C).

The insulating film 2610 is formed using an insulating material such as silicon oxide, silicon nitride, silicon oxynitride ($SiO_xN_y$) (x>y>0), or silicon nitride oxide ($SiN_xO_y$) (x>y>0) by a CVD method, a sputtering method, or the like. Here, a silicon oxide film is formed as the insulating film 2610 with the use of a TEOS (tetraethyl orthosilicate) gas by a normal-pressure CVD method or a low-pressure CVD method.

Figure 22A:
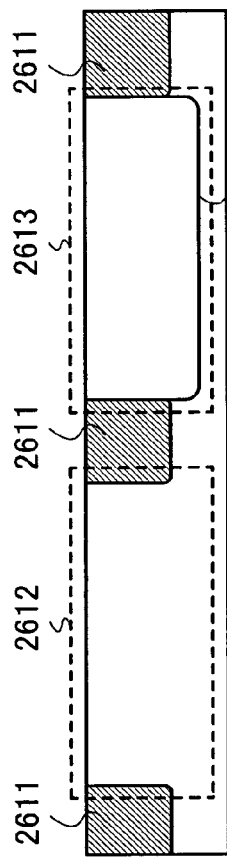
FIGS. 22A to 22C are views showing an example of a method for manufacturing a semiconductor device of the present invention.

Next, a surface of the substrate 2600 is exposed by performing grinding treatment, polishing treatment, or CMP (chemical mechanical polishing) treatment. Here, when the surface of the substrate 2600 is exposed, regions 2612 and 2613 are each provided between insulating films 2611 formed in the depressions 2608 of the substrate 2600. Note that the insulating films 2611 are formed by removing the insulating film 2610 formed over the surface of the substrate 2600 by grinding treatment, polishing treatment, or CMP treatment. Then, an impurity element imparting p-type conductivity is selectively introduced, so that a p-well 2615 is formed in the region 2613 (see FIG. 22A).

As the impurity element imparting p-type conductivity, boron (B), aluminum (Al), gallium (Ga), or the like can be used. Here, boron (B) is introduced into the region 2613 as the impurity element.

Note that although an impurity element is not introduced into the region 2612 because the n-type semiconductor substrate is used as the substrate 2600 in this embodiment, an n-well may be formed in the region 2612 by introduction of an impurity element imparting n-type conductivity. As the impurity element imparting n-type conductivity, phosphorus (P), arsenic (As), or the like can be used.

On the other hand, in the case where a p-type semiconductor substrate is used, an impurity element imparting n-type conductivity may be introduced only into the region 2612 so as to form an n-well, not into the region 2613.

Figure 22B:
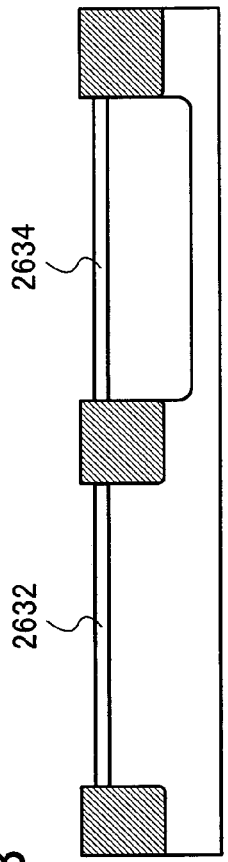

Next, insulating films 2632 and 2634 are formed on the surfaces of the regions 2612 and 2613 in the substrate 2600, respectively (see FIG. 22B).

Each of the insulating films 2632 and 2634 can be formed of a silicon oxide film by oxidizing the surfaces of the regions 2612 and 2613 in the substrate 2600 by heat treatment, for example. Alternatively, each of the insulating films 2632 and 2634 can be formed to have a stacked-layer structure of a silicon oxide film and a film containing oxygen and nitrogen (silicon oxynitride film) by forming the silicon oxide film by a thermal oxidation method and then nitriding the surface of the silicon oxide film by nitridation treatment.

Further alternatively, as described above, the insulating films 2632 and 2634 may be formed using plasma treatment. For example, oxidation treatment or nitridation treatment is performed by high-density plasma treatment on the surfaces of the regions 2612 and 2613 provided in the substrate 2600, so that silicon oxide ($SiO_x$) films or silicon nitride ($SiN_x$) films can be formed as the insulating films 2632 and 2634. Alternatively, after oxidation treatment is performed on the surfaces of the regions 2612 and 2613 by high-density plasma treatment, high-density plasma treatment may be performed again to perform nitridation treatment. In this case, silicon oxide films are formed on the surfaces of the regions 2612 and 2613, and silicon oxynitride films are formed over the silicon oxide films, so that each of the insulating films 2632 and 2634 is formed as a film having a stacked-layer structure of the silicon oxide film and the silicon oxynitride film. Further alternatively, after silicon oxide films are formed on the surfaces of the regions 2612 and 2613 by a thermal oxidation method, oxidation treatment or nitridation treatment may be performed by high-density plasma treatment.

Note that the insulating films 2632 and 2634 formed over the regions 2612 and 2613 in the substrate 2600 function as gate insulating films in a transistor to be completed later.

Figure 22C:
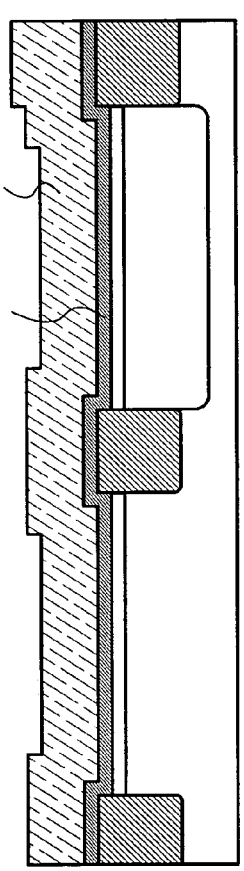

Next, a conductive film is formed so as to cover the insulating films 2632 and 2634 formed over the regions 2612 and 2613 provided in the substrate 2600 (see FIG. 22C). Here, a conductive film 2636 and a conductive film 2638 are stacked in that order as the conductive film. It is needless to say that the conductive film may be formed to have a single-layer structure or a staked-layer structure including three or more layers.

The conductive films 2636 and 2638 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above-described elements as its main component. Alternatively, a metal nitride film obtained by nitridation of the element may be used. Further alternatively, a semiconductor material typified by polycrystalline silicon doped with an impurity element such as phosphorus may be used.

Here, the conductive film is formed to have a stacked-layer structure by formation of the conductive film 2636 using tantalum nitride and formation of the conductive film 2638 using tungsten thereover. Alternatively, a single-layer or stacked-layer film of tantalum nitride, tungsten nitride, molybdenum nitride, and titanium nitride can be used as the conductive film 2636, and a single-layer or stacked-layer film of tungsten, tantalum, molybdenum, and titanium can be used as the conductive film 2638.

Figure 23A:
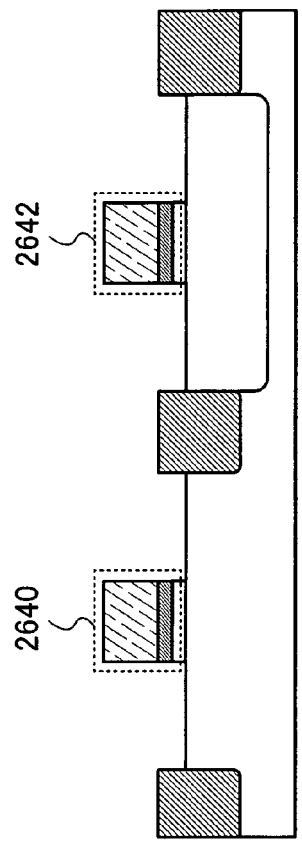
FIGS. 23A to 23C are views showing an example of a method for manufacturing a semiconductor device of the present invention.

Next, by selectively etching and removing the conductive films 2636 and 2638 which are stacked, the conductive films 2636 and 2638 are partially left over the regions 2612 and 2613 in the substrate 2600 to form conductive films 2640 and 2642 each functioning as a gate electrode (see FIG. 23A). In addition, here, surfaces of parts of the regions 2612 and 2613 which do not overlap with the conductive films 2640 and 2642 are exposed in the substrate 2600.

Specifically, in the region 2612 in the substrate 2600, a part of the insulating film 2632 formed below the conductive film 2640, which does not overlap with the conductive film 2640, is selectively removed so that ends of the conductive film 2640 and the insulating film 2632 are roughly aligned with each other. In the region 2614 in the substrate 2600, a part of the insulating film 2634 formed below the conductive film 2642, which does not overlap with the conductive film 2642, is selectively removed so that ends of the conductive film 2642 and the insulating film 2634 are roughly aligned with each other.

In this case, parts of the insulating films and the like which do not overlap with the conductive films 2640 and 2642 may be removed at the same time as the formation of the conductive films 2640 and 2642; or may be removed after formation of the conductive films 2640 and 2642, by using the remaining resist mask or the conductive films 2640 and 2642 as masks.

Figure 23B:
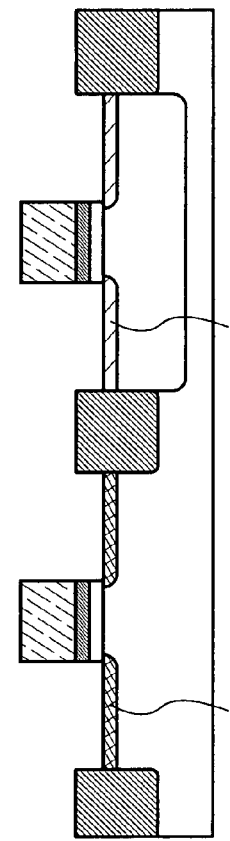

Next, an impurity element is selectively introduced into the regions 2612 and 2613 in the substrate 2600 so that an impurity region 2648 and an impurity region 2650 are formed (see FIG. 23B). Here, an impurity element imparting n-type conductivity is selectively introduced into the region 2613 at low concentration with the use of the conductive film 2642 as a mask. On the other hand, an impurity element imparting p-type conductivity is selectively introduced into the region 2612 at low concentration with the use of the conductive film 2640 as a mask. As the impurity element imparting n-type conductivity, phosphorus (P), arsenic (As), or the like can be used. As the impurity element imparting p-type conductivity, boron (B), aluminum (Al), gallium (Ga), or the like can be used.

Next, sidewalls 2654 are formed in contact with side surfaces of the conductive films 2640 and 2642. Specifically, a film including an inorganic material such as silicon, an oxide of silicon, or a nitride of silicon, or a film including an organic material such as an organic resin is formed to have a single-layer structure or a stacked-layer structure by a plasma CVD method, a sputtering method, or the like. Then, the insulating film is selectively etched by anisotropic etching mainly in the perpendicular direction, such that the insulating film is formed in contact with the side surfaces of the conductive films 2640 and 2642. Note that the sidewalls 2654 are used as masks for doping when LDD (lightly doped drain) regions are formed. Further, here, the sidewalls 2654 are formed in contact with side surfaces of insulating films and floating gate electrodes formed below the conductive films 2640 and 2642 as well.

Figure 23C:
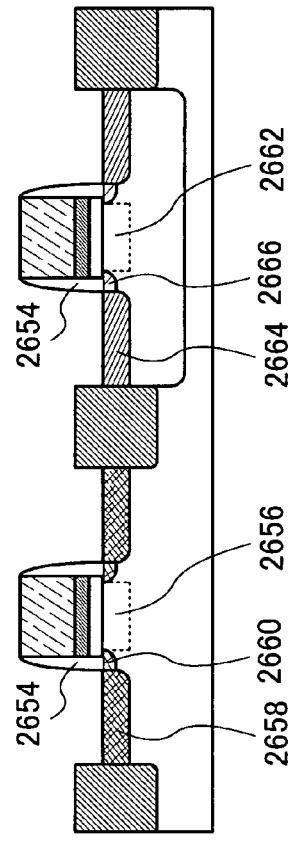

After that, an impurity element is introduced into the regions 2612 and 2613 in the substrate 2600 with the use of the sidewalls 2654 and the conductive films 2640 and 2642 as masks, so that impurity regions functioning as source and drain regions are formed (see FIG. 23C). Here, an impurity element imparting n-type conductivity is introduced into the region 2613 in the substrate 2600 at high concentration with the use of the sidewalls 2654 and the conductive film 2642 as masks, while an impurity element imparting p-type conductivity is introduced into the region 2612 at high concentration with the use of the sidewalls 2654 and the conductive film 2640 as masks.

As a result, in the region 2612 in the substrate 2600, impurity regions 2658 forming source and drain regions, low-concentration impurity regions 2660 forming LDD regions, and a channel formation region 2656 are formed. In the region 2613 in the substrate 2600, impurity regions 2664 forming source and drain regions, low-concentration impurity regions 2666 forming LDD regions, and a channel formation region 2662 are formed.

Note that in this embodiment, introduction of the impurity element is performed under a condition in which the parts of the regions 2612 and 2613 in the substrate 2600, which do not overlap with the conductive films 2640 and 2642, are exposed. Therefore, the channel formation regions 2656 and 2662 formed in the regions 2612 and 2613 in the substrate 2600 respectively can be formed in a self-aligned manner with the conductive films 2640 and 2642.

Figure 24A:
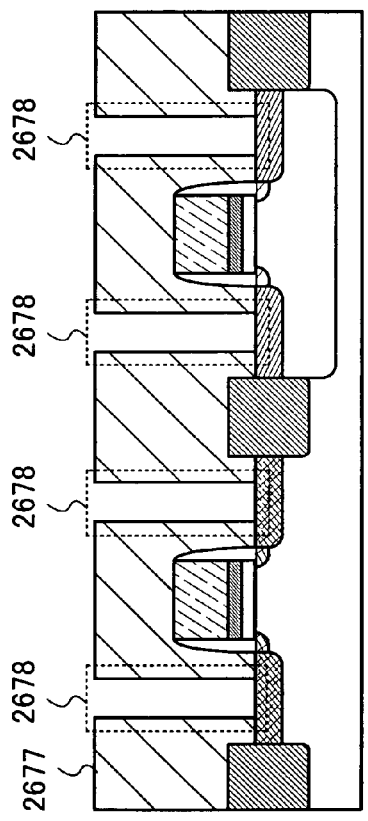
FIGS. 24A and 24B are views showing an example of a method for manufacturing a semiconductor device of the present invention.

Next, a second insulating film 2677 is formed so as to cover the insulating films, the conductive films, or the like provided over the regions 2612 and 2613 in the substrate 2600, and openings 2678 are formed in the insulating film 2677 (see FIG. 24A).

The second insulating film 2677 can be formed by a CVD method, a sputtering method, or the like to have a single-layer structure or a stacked-layer structure of an insulating film containing oxygen or nitrogen, such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film; a film containing carbon such as DLC (diamond like carbon); an organic material such as epoxy, polyimide, polyamide, polyvinyl phenol, benzocyclobutene, or acrylic; or a siloxane material such as a siloxane resin. Note that the siloxane material is a material including a Si—O—Si bond. Siloxane has a skeleton structure containing a bond of silicon (Si) and oxygen (O). As a substituent, an organic group containing at least hydrogen (for example, an alkyl group or aromatic hydrocarbon) can be used. Alternatively, a fluoro group may be used as the substituent. Further alternatively, as the substituent, an organic group containing at least hydrogen and a fluoro group may be used.

Figure 24B:
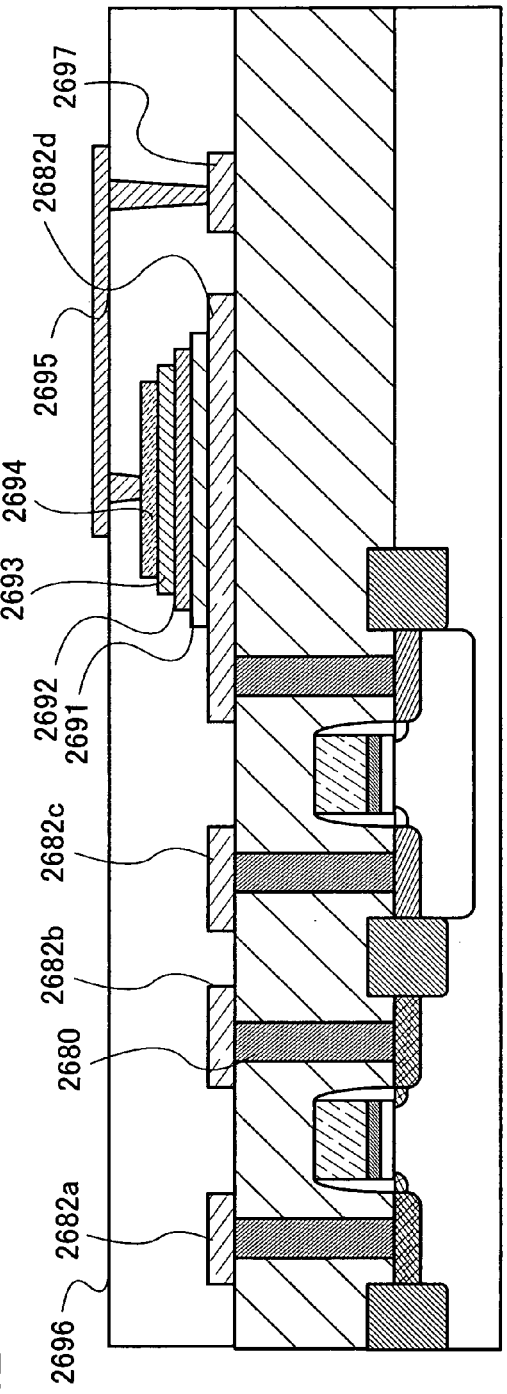

Next, conductive films 2680 are formed in the openings 2678 by a CVD method, and conductive films 2682a to 2682d are selectively formed over the insulating film 2677 so as to be electrically connected to the conductive films 2680 (see FIG. 24B).

Each of the conductive films 2680, and 2682a to 2682d is formed by a CVD method, a sputtering method, or the like to have a single-layer structure or a stacked-layer structure with the use of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above-described elements as its main component. An alloy material containing aluminum as its main component corresponds to a material which contains aluminum as its main component and also contains nickel, or an alloy material which contains aluminum as its main component and also contains nickel and one or both of carbon and silicon, for example. Each of the conductive films 2680, and 2682a to 2682d preferably employ, for example, a stacked layer structure of a barrier film, an aluminum-silicon (Al—Si) film, and a barrier film, or a stacked layer structure of a barrier film, an aluminum-silicon (Al—Si) film, a titanium nitride film, and a barrier film. It is to be noted that a barrier film corresponds to a thin film formed by using titanium, a nitride of titanium, molybdenum, or a nitride of molybdenum. Aluminum and aluminum silicon which have low resistance and are inexpensive are optimal materials for forming the conductive film 2680. In addition, generation of a hillock of aluminum or aluminum silicon can be prevented when upper and lower barrier layers are formed. Furthermore, when the barrier film is formed using titanium that is a highly-reducible element, even if a thin natural oxide film is formed over the crystalline semiconductor film, the natural oxide film is reduced so that preferable contact with the crystalline semiconductor film can be obtained. Here, each of the conductive films 2680 can be formed by selective growth of tungsten (W) by a CVD method.

Through the above-described steps, a p-channel transistor formed in the region 2612 and an n-channel transistor formed in the region 2613 in the substrate 2600 can be obtained.

Note that the structure of the transistor included in the semiconductor device of the present invention is not limited to the structure shown in the drawings. For example, an inversely staggered structure, a FinFET structure, or the like may be employed. When a FinFET structure is used, a short-channel effect associated with miniaturization of a size of a transistor can be suppressed, which is preferable.

The semiconductor device in this embodiment includes a battery capable of supplying power to the semiconductor integrated circuit. As the battery, a thin film secondary battery or a capacitor such as an electric double layer capacitor is preferably used. In this embodiment, the connection of the transistor formed in thin embodiment and a thin film secondary battery is described.

In this embodiment, the secondary battery is formed by being stacked over a conductive film 2682d which is connected to the transistor. Thin film layers: a collector thin film, a negative active material layer, a solid electrolyte layer, a positive active material layer, and a collector thin film, are stacked in that order to form the thin film secondary battery (FIG. 24B). Therefore, it is necessary for a material of the conductive film 2682d which is also used for the collector thin film of the secondary battery to have high adhesion to a negative active material and low resistance. Aluminum, copper, nickel, vanadium, and the like are particularly preferable.

Next, the structure of a thin film secondary battery is described in detail. A negative active material layer 2691 is formed over the conductive film 2682d. Vanadium oxide ($V_2O_5$) or the like is generally used for the negative active material layer 2691. Then, a solid electrolyte layer 2692 is formed over the negative active material layer 2691. Lithium phosphate ($Li_3PO_4$) or the like is generally used for the solid electrolyte layer 2692. Then, a positive active material layer 2693 is formed over the solid electrolyte layer 2692. Lithium manganese ($LiMn_2O_4$) or the like is generally used for the positive active material layer 2693. Alternatively, lithium cobalt oxide ($LiCoO_2$) or lithium nickel oxide ($LiNiO_2$) may be used. Then, a collector thin film 2694 which serves as an electrode is formed over the positive active material layer 2693. It is necessary for the collector thin film 2694 to have high adhesion to the positive active material layer 2693 and low resistance, and thus, aluminum, copper, nickel, vanadium, or the like can be used as the collector thin film 2694.

Each of the thin film layers, that is, the negative active material layer 2691, the solid electrolyte layer 2692, the positive active material layer 2693, and the collector thin film 2694, may be formed using a sputtering technique or an evaporation technique. The thickness of each layer is preferably 0.1 to 3 μm.

Next, a resin is applied to form an interlayer film 2696. Then, the interlayer film 2696 is etched to form a contact hole. The interlayer film 2696 is not limited to being formed of a resin. Another type of film, such as a CVD oxide film, may also be used; however, a resin is preferable in terms of planarity. Alternatively, the contact hole may be formed using a photosensitive resin without etching. After that, a wiring layer 2695 is formed over the interlayer film 2696 and connected to the wiring 2697 and thus electrical connection of the thin film secondary battery is secured.

By employing the structure described above, the semiconductor device of the present invention can have a structure in which a transistor is formed over a single crystal substrate and a thin film secondary battery is provided thereover. Therefore, the semiconductor device of the present invention can be greatly reduced in thickness and size and have flexibility.

Note that the method for manufacturing the semiconductor device of this embodiment can be applied to the semiconductor device of any of the other embodiments in this specification. That is, regarding the semiconductor device of this embodiment, the transmitting and receiving circuit can be formed of fewer transistors without impairing the function of the transmitting and receiving circuit. Therefore, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

Embodiment 6

In this embodiment, uses of the semiconductor device including the transmitting and receiving circuit of the present invention, which is described in any of the above-described embodiments are described. The semiconductor device of the present invention can be used as a so-called ID label, ID tag, or ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, or tags on products such as an electronic appliances or on packs. Electronic appliances refer to a liquid crystal display device, an EL display device, a television set (also called a TV set simply, a TV receiver, or a television receiver), a mobile phone, and the like. In this embodiment, an application of the present invention and an example of a product with the semiconductor device of the present invention are described with reference to FIGS. 9A to 9E.

Figure 9A:
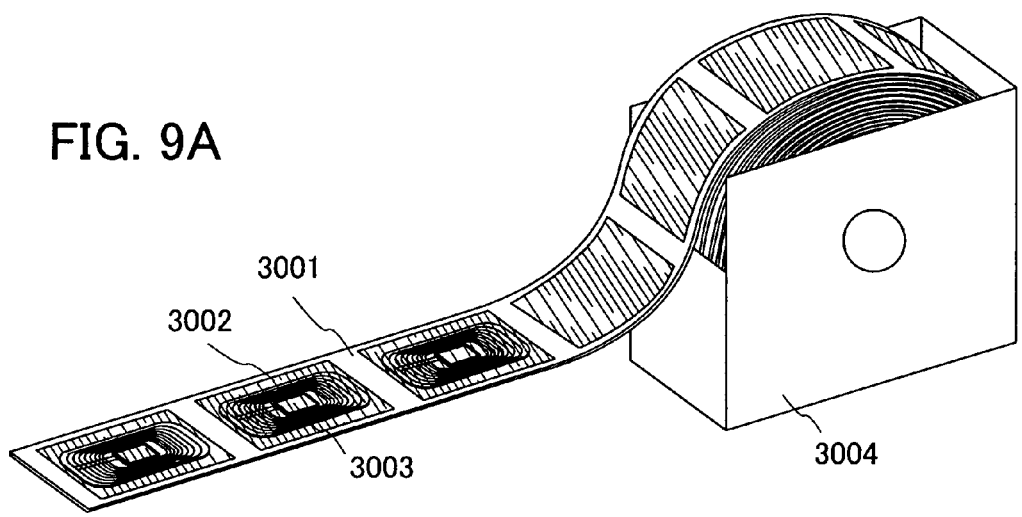
FIGS. 9A to 9E are diagrams each showing an example of an application mode of a semiconductor device of the present invention.

FIG. 9A shows an example of the state of completed products of a semiconductor device of the present invention. A plurality of ID labels 3003 each incorporating a semiconductor device 3002 is formed on a label board 3001 (separate paper). The ID labels 3003 are put in a box 3004. On the ID label 3003, information on a product or service (for example, a name of the product, a brand, a trademark, a trademark owner, a seller, a manufacturer, and the like) is written. On the other hand, the ID number which is specific to the product (or the kind of the product) is assigned to the incorporated semiconductor device, so that forgery, infringement of intellectual property rights such as a trademark and a patent, and illegality such as unfair competition can be figured out. Further, a lot of information which is too much to be written clearly on a container or a label of the product, for example, production area, selling area, quality, raw material, efficacy, use, quantity, shape, price, production method, directions for use, production time, time of the use, expiration date, instructions of the product, information on the intellectual property of the product, and the like can be inputted in the semiconductor device; therefore, a trader and a consumer can access the information with the use of a simple reader. The producer can also easily carry out rewriting or deleting of the information, while the trader and the consumer are not allowed to carry out rewriting or deleting of the information. Note that a display portion may be provided on the semiconductor device so that such information can be displayed.

Figure 9B:
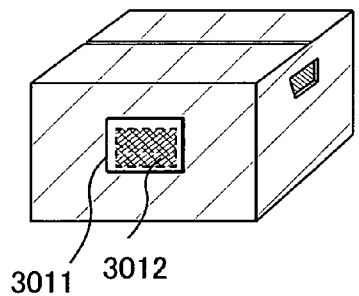

FIG. 9B shows a semiconductor device 3011 with a label shape, in which a semiconductor device 3012 is incorporated. Mounting the semiconductor device 3011 on a product allows the product to be managed easily. For example, when the product is stolen, the thief can be figured out quickly by tracing of the pathway of the product. Thus, products which are superior in so-called traceability can be distributed by being provided with the semiconductor devices.

Figure 9C:
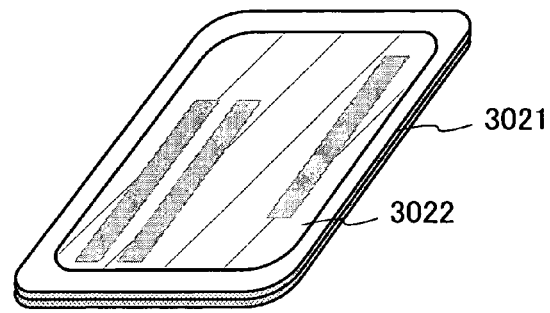

FIG. 9C shows an example of the state of a completed product of an ID card 3021 including a semiconductor device 3022. The ID card 3021 includes all kinds of cards such as a cash card, a credit card, a prepaid card, an electronic ticket, electronic money, a telephone card, and a membership card. Note that a display portion may be provided on a surface of the ID card 3021 so that various information is displayed.

Figure 9D:
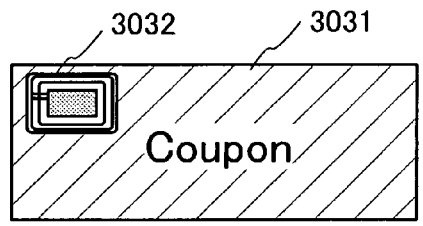

FIG. 9D shows an example of the state of a completed product of a bearer bond 3031. A semiconductor device 3032 is embedded in the bearer bond 3031 and is protected by a resin formed in the periphery thereof. Here, the resin is filled with a filler. The bearer bond 3031 can be formed in the same manner as the semiconductor device of the present invention. Note that the aforementioned bearer bonds include stamps, tickets, admission tickets, merchandise coupons, book coupons, stationery coupons, beer coupons, rice coupons, various gift coupons, various service coupons, and the like. Needless to say, they are not limited thereto. In addition, when the semiconductor device 3032 of the present invention is provided in bills, coins, securities, bearer bonds, documents, or the like, an authentication function can be provided. By utilization of the authentication function, forgery can be prevented.

Figure 9E:
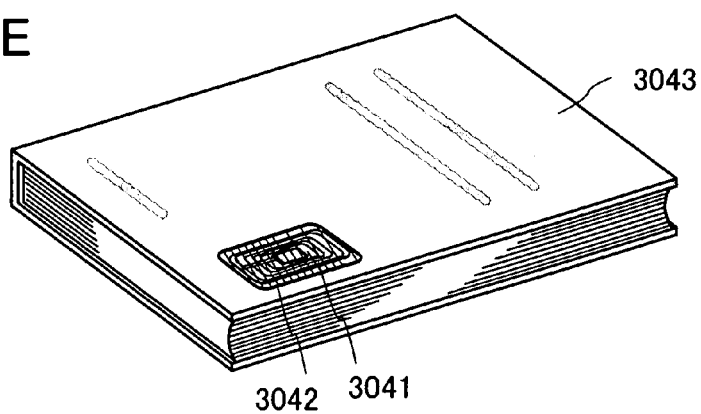

FIG. 9E shows a book 3043 to which an ID label 3041 including a semiconductor device 3042 is attached. The semiconductor device 3042 of the present invention is fixed on objects by, for example, being attached to a surface or being embedded therein. As shown in FIG. 9E, the semiconductor device 3042 can be embedded in paper of a book, or embedded in an organic resin of a package. Since the semiconductor device 3042 of the present invention can reduced in size, thickness, and weight, it can be fixed on objects without spoiling the design thereof.

In addition, although not shown here, the efficiency of a system such as an inspection system can be improved by provision of the semiconductor device of the present invention in, for example, packaging containers, storage media, personal belongings, foods, clothing, everyday articles, electronic appliances, or the like. Further, counterfeits and theft can be prevented by provision of the semiconductor device on vehicles. Individual creatures such as animals can be easily identified by being implanted with the semiconductor device. For example, year of birth, sex, breed, and the like can be easily identified by implantation of the semiconductor device in creatures such as domestic animals.

Note that the semiconductor device including the transmitting and receiving circuit of the present invention can be applied to various products besides the above-described products. Regarding the semiconductor device described in this embodiment, the transmitting and receiving circuit can be formed of fewer transistors without impairing the function of the transmitting and receiving circuit. Therefore, the semiconductor device of the present invention can be reduced in size. Since the semiconductor device of the present invention can prevent a reduction in power conversion efficiency, a power supply potential can be efficiently generated and the communication distance of the semiconductor device can be extended. Further, the semiconductor device of the present invention can be reduced in size by an amount proportional to how much the number of elements included in the semiconductor device is reduced by, and thus the cost can be reduced.

This application is based on Japanese Patent Application serial no. 2006-311077 filed with Japan Patent Office on Nov. 17, 2006, the entire contents of which are hereby incorporated by reference.

What is claimed is:

1. A transmitting and receiving circuit comprising:
a voltage doubler rectifier circuit having N stages, each of which comprises a capacitor, where N is a positive integer;
a circuit having a modulation function connected to the voltage doubler rectifier circuit;
wherein the capacitor in one of N stages having one electrode connected to an input terminal of the transmitting and receiving circuit; and the other electrode connected to a node connected to a circuit having a demodulation function, and
wherein the capacitor and a resistor are connected to an output terminal of the circuit having a demodulation function.

2. The transmitting and receiving circuit according to claim 1, wherein each of the circuit having a modulation function and the circuit having a demodulation function comprises a plurality of diodes.

3. The transmitting and receiving circuit according to claim 2, wherein each of the plurality of diodes is configured with a diode-connected transistor.

4. The transmitting and receiving circuit according to claim 3, wherein the transistor is an n-channel transistor or a p-channel transistor.

5. The transmitting and receiving circuit according to claim 1, wherein the capacitance of the capacitor is 1 to 10 pF and the resistance of the resistor is 10 to 100 kΩ.

6. The transmitting and receiving circuit according to claim 1, wherein a diode is connected between the output terminal of the circuit having a demodulation function and an output terminal of the voltage doubler rectifier circuit having N stages.

7. The transmitting and receiving circuit according to claim 1, wherein a capacitor is connected to the output terminal of the voltage doubler rectifier circuit having N stages.

8. A semiconductor device comprising:
an antenna which receives a radio wave supplied externally;
a transmitting and receiving circuit connected to the antenna, and performing output, modulation, and demodulation of a DC voltage when a wireless signal received by the antenna is inputted;
a power supply circuit generating a power supply voltage from the DC voltage; and
a memory circuit and a control circuit to which a demodulated signal is inputted,
wherein the transmitting and receiving circuit comprises a voltage doubler rectifier circuit having N stages, each of which comprises a capacitor, where N is a positive integer;
wherein the voltage doubler rectifier circuit having N stages is connected to a circuit having a modulation function;
wherein the capacitor in one of N stages having one electrode connected to an input terminal of the transmitting and receiving circuit; and the other electrode connected to a node connected to a circuit having a demodulation function, and
wherein the capacitor and a resistor are connected to an output terminal of the circuit having a demodulation function.

9. The semiconductor device according to claim 8, wherein each of the circuit having a modulation function and the circuit having a demodulation function comprises a plurality of diodes.

10. The semiconductor device according to claim 9, wherein each of the plurality of diodes is configured with a diode-connected transistor.

11. The semiconductor device according to claim 10, wherein the transistor is an n-channel transistor or a p-channel transistor.

12. The semiconductor device according to claim 8, wherein the capacitance of the capacitor is 1 to 10 pF and the resistance of the resistor is 10 to 100 kΩ.

13. The semiconductor device according to claim 8, wherein a diode is connected between the output terminal of the circuit having a demodulation function and an output terminal of the voltage doubler rectifier circuit having N stages.

14. The semiconductor device according to claim 8, wherein a capacitor is connected to the output terminal of the voltage doubler rectifier circuit having N stages.

* * * * *